(12) United States Patent
Kim et al.

(10) Patent No.: US 8,343,845 B2
(45) Date of Patent: Jan. 1, 2013

(54) METHODS OF MANUFACTURING CAPACITOR STRUCTURES AND METHODS OF MANUFACTURING SEMICONDUCTOR DEVICES USING THE SAME

(75) Inventors: Yong-Il Kim, Hwaseong-si (KR); Dae-Ik Kim, Yongin-si (KR); Yun-Sung Lee, Seongnam-si (KR); Nam-Jung Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 12/659,769

(22) Filed: Mar. 19, 2010

(65) Prior Publication Data
US 2010/0240179 A1    Sep. 23, 2010

(30) Foreign Application Priority Data
Mar. 20, 2009    (KR) .................. 10-2009-0023929

(51) Int. Cl.
*H01L 21/30*    (2006.01)
(52) U.S. Cl. ............... 438/397; 438/396; 257/296
(58) Field of Classification Search ............ 257/296, 257/301; 361/303; 438/244, 397, 396
See application file for complete search history.

(56) References Cited

U.S. PATENT DOCUMENTS

| 7,557,015 B2* | 7/2009 | Sandhu et al. ............... 438/397 |
| 2005/0093046 A1* | 5/2005 | Ahn ............................. 257/296 |
| 2006/0046382 A1 | 3/2006 | Yoon et al. |
| 2006/0079049 A1* | 4/2006 | Kundalgurki et al. ....... 438/243 |
| 2008/0003741 A1 | 1/2008 | Park et al. |
| 2010/0177459 A1* | 7/2010 | Wu et al. ..................... 361/303 |

FOREIGN PATENT DOCUMENTS

| KR | 10-2005-0042624 A | 5/2005 |
| KR | 10-2006-0018933 A | 3/2006 |

* cited by examiner

*Primary Examiner* — Kimberly Rizkallah
*Assistant Examiner* — Errol Fernandes
(74) *Attorney, Agent, or Firm* — Lee & Morse, P.C.

(57) ABSTRACT

A capacitor structure includes a plurality of lower electrodes on a substrate, the lower electrodes having planar top surfaces and being arranged in a first direction to define a lower electrode column, a plurality of lower electrode columns being arranged in a second direction perpendicular to the first direction to define a lower electrode matrix, a plurality of supports on upper sidewalls of at least two adjacent lower electrodes, a dielectric layer on the lower electrodes and the supports, and an upper electrode on the dielectric layer.

17 Claims, 30 Drawing Sheets

1ST DIRECTION
2ND DIRECTION
3RD DIRECTION

METHODS OF MANUFACTURING CAPACITOR STRUCTURES AND METHODS OF MANUFACTURING SEMICONDUCTOR DEVICES USING THE SAME

BACKGROUND

1. Field

Example embodiments relate to capacitor structures, methods of manufacturing the same, semiconductor devices including the capacitor structures, and methods of manufacturing the same. More particularly, example embodiments relate to capacitor structures having a high capacitance, methods of manufacturing the same, semiconductor devices including the capacitor structures, and methods of manufacturing the same.

2. Description of the Related Art

As semiconductor devices have been highly integrated, an area of a unit cell may be decreased. Therefore, in order to avoid decreased capacitance of a capacitor, the capacitor may require a large effective surface area, e.g., a cylindrical shape. However, when the capacitor has a lower electrode having a high aspect ratio, the capacitor may be unstable, e.g., fall down and contact adjacent capacitors, thereby causing damage and a leakage current therethrough.

SUMMARY

Embodiments are therefore directed to capacitor structures, methods of manufacturing the same, semiconductor devices including the capacitor structures, and methods of manufacturing the same, which substantially overcome one or more of the problems due to the limitations and disadvantages of the related art.

It is therefore a feature of an embodiment to provide capacitor structures having high capacitance and stability.

It is therefore another feature of an embodiment to provide methods of manufacturing capacitor structures having high capacitance and stability.

It is yet another feature of an embodiment to provide semiconductor devices including capacitor structures having high capacitance and stability.

It is still another feature of an embodiment to provide methods of manufacturing semiconductor devices including capacitor structures having high capacitance and stability.

At least one of the above and other features and advantages may be realized by providing a capacitor structure. The capacitor structure may include a plurality of lower electrodes having a planar top surface, a plurality of supports, a dielectric layer and an upper electrode. The lower electrodes are on a substrate and arranged in a first direction to form a lower electrode column. A plurality of the lower electrode column is arranged in a second direction perpendicular to the first direction to form a lower electrode matrix. The supports are on upper sidewalls of the at least two adjacent lower electrodes. The dielectric layer is on the lower electrodes and the supports. The upper electrode is on the dielectric layer.

In example embodiments, the lower electrodes may be arranged at a first distance from each other in a first direction, and at a third distance from each other in a third direction at an acute angle to the second direction.

In example embodiments, each of the supports may extend in the third direction.

In example embodiments, each of the supports may extend in the second direction.

In example embodiments, each of the supports may contact upper sidewalls of the at least two adjacent lower electrodes in the first direction.

In example embodiments, each of the supports may contact upper sidewalls of the at least two adjacent lower electrodes in the third direction.

In example embodiments, each of the supports may partially enclose the upper sidewalls of the at least two adjacent lower electrodes.

In example embodiments, the lower electrodes may include a metal.

In example embodiments, the lower electrodes may have a cylindrical shape or a pillar shape.

At least one of the above and other features and advantages may also be realized by providing a method of manufacturing a capacitor structure. In the method, a mold layer is formed on a substrate. A plurality of sacrificial layer patterns and a plurality of supports that are parallel to each other are formed on the substrate. The sacrificial layer patterns, the supports and the mold layer are partially removed to form a plurality of holes therethrough exposing top surfaces of the substrate. A plurality of lower electrodes is formed on the exposed top surfaces of the substrate in the holes. The sacrificial layer patterns are removed. The mold layer is removed to expose sidewalls of the lower electrodes. A dielectric layer is formed on the lower electrodes and the supports. An upper electrode is formed on the dielectric layer.

In example embodiments, when the sacrificial layer patterns and the supports are formed, the sacrificial layer patterns may be formed on the mold layer. A supporting layer may be formed on the mold layer to cover the sacrificial layer patterns and fill spaces between the sacrificial layer patterns. An upper portion of the supporting layer may be planarized to form the supports.

In example embodiments, when the sacrificial layer patterns and the supports are formed, the supports may be formed on the mold layer. A sacrificial layer is formed on the mold layer to cover the supports and fill spaces between the supports. An upper portion of the sacrificial layer is planarized to form the sacrificial layer patterns.

In example embodiments, when the lower electrodes are formed, a lower electrode layer may be formed conformally on the exposed top surface of the substrate, inner walls of the holes, the sacrificial layer patterns and the supports. An upper portion of the lower electrode layer may be removed on the sacrificial layer patterns and the supports to form the lower electrodes having a cylindrical shape.

In example embodiments, before the upper portion of the lower electrode layer is removed, a second sacrificial layer on the lower electrode may be further formed to fill remaining portions of the holes.

In example embodiments, after the lower electrodes having the cylindrical shape is formed, second sacrificial layer patterns filling remaining portions of the holes may be further formed.

In example embodiments, when the mold layer is removed, the second sacrificial layer patterns may be removed.

In example embodiments, when the lower electrodes are formed, a conductive layer may be formed on the exposed top surfaces of the substrate, the sacrificial layer patterns and the supports to fill the holes. An upper portion of the conductive layer on the sacrificial layer patterns and the supports may be removed.

In example embodiments, the sacrificial layer patterns may be formed using silicon-germanium.

In example embodiments, the supports may be formed using silicon nitride.

In example embodiments, each supports may have a linear shape

In example embodiments, the holes may be formed at a first distance from each other in a first direction, and at a second distance from each other in a third direction at an acute direction to a second direction. The first and second directions may be perpendicular, to each other.

At least one of the above and other features and advantages may also be realized by providing a semiconductor device. The semiconductor device includes a plurality of transistors, a bitline, capacitor contact plugs and a capacitor structure. The transistors are on a substrate, and each transistor has a first impurity region and second impurity regions. The bitline is electrically connected to the first impurity region. The capacitor contact plugs are electrically connected to the second impurity regions. The capacitor structure has a plurality of lower electrodes having a planar top surface, a plurality of supports, a dielectric layer and an upper electrode. The lower electrodes are on the capacitor contact plugs, and are arranged in a first direction to form a lower electrode column. A plurality of the lower electrode column is arranged in a second direction perpendicular to the first direction to form a lower electrode matrix. The supports are on upper sidewalls of the at least two adjacent lower electrodes. The dielectric layer is on the lower electrodes and the supports. An upper electrode is on the dielectric layer.

At least one of the above and other features and advantages may also be realized by providing a method of manufacturing a semiconductor device. In the method, a plurality of transistors, each of which has a first impurity region and second impurity regions, is formed on a substrate. A bitline electrically connected to the first impurity region is formed. Capacitor contact plugs electrically connected to the second impurity regions are formed. A capacitor structure is formed by following steps; a plurality of lower electrodes having a planar top surface is formed on the capacitor contact plugs. The lower electrodes are arranged in a first direction to form a lower electrode column. A plurality of the lower electrode column is arranged in a second direction perpendicular to the first direction to form a lower electrode matrix. A plurality of supports is formed on upper sidewalls of the at least two adjacent lower electrodes. A dielectric layer is formed on the lower electrodes and the supports. An upper electrode is formed on the dielectric layer.

BRIEF DESCRIPTION OF THE DRAWINGS

The above and other features and advantages will become more apparent to those of ordinary skill in the art by describing in detail exemplary embodiments with reference to the attached drawings, in which:

FIGS. 3A to 12A illustrate perspective views of stages in a method of manufacturing a capacitor structure according to example embodiments, and FIGS. 3B to 12B illustrate respective top views of the stages in FIGS. 3A to 12A;

FIGS. 13A to 15A illustrate perspective views of stages in a method of manufacturing a capacitor structure according to other example embodiments, and FIGS. 13B to 15B illustrate respective top views of the stages in FIGS. 13A to 15A;

FIGS. 16A to 18A illustrate perspective views of stages in a method of manufacturing a capacitor structure according to other example embodiments, and FIGS. 16B to 18B illustrate respective top views of the stages in FIGS. 16A to 18A;

DETAILED DESCRIPTION

Figure 1:
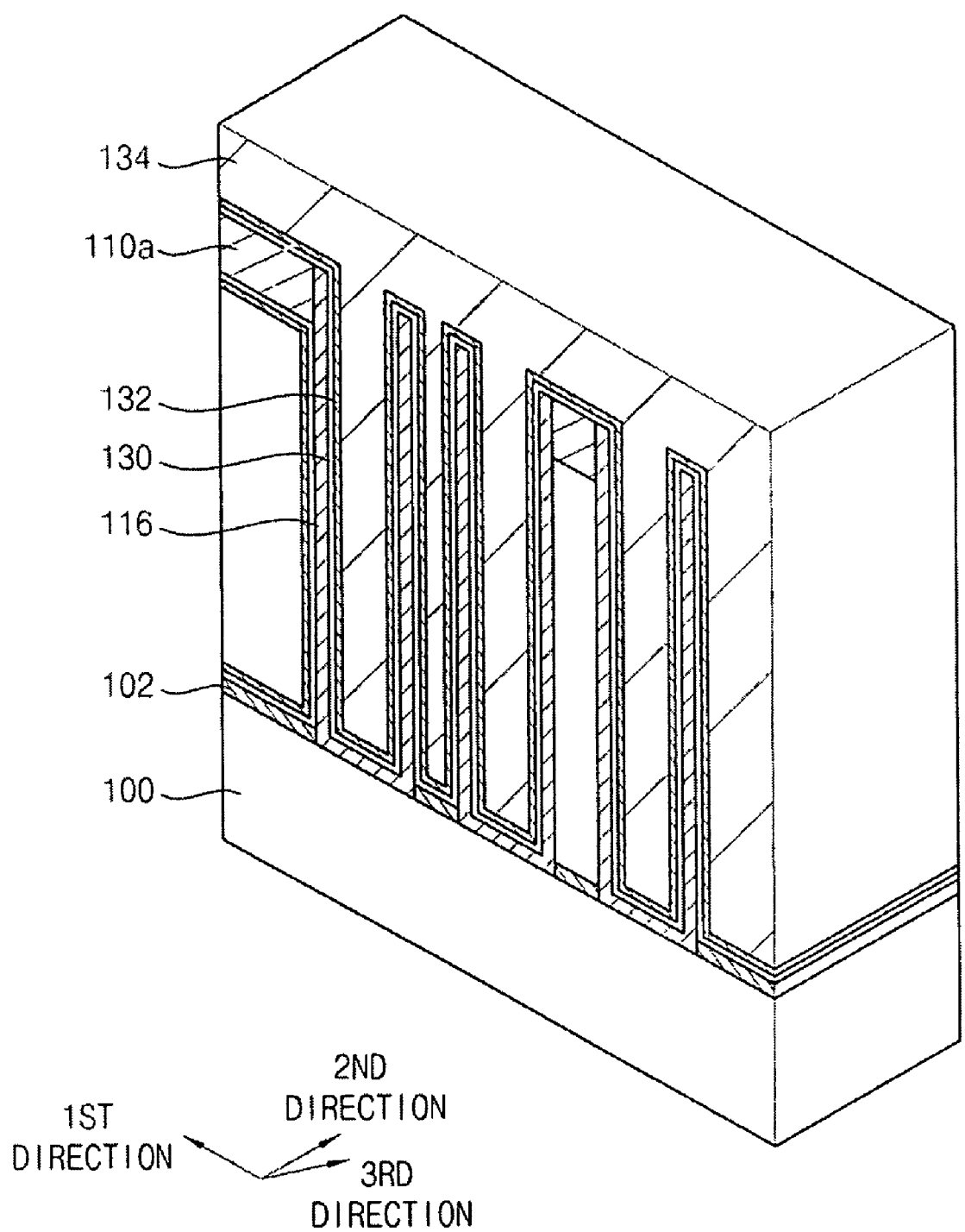
FIG. 1 illustrates a perspective view of a capacitor structure in accordance with example embodiments.

Korean Patent Application No. 10-2009-0023929, filed on Mar. 20, 2009, in the Korean Intellectual Property Office, and entitled: "Capacitor Structures, Methods of Manufacturing the Same, Semiconductor Devices Including the Capacitor Structures and Methods of Manufacturing the Same," is incorporated by reference herein in its entirety.

Various example embodiments will be described more fully hereinafter with reference to the accompanying drawings, in which some example embodiments are shown. The present example embodiments may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In addition, it will also be understood that when a layer is referred to as being "between" two layers, it can be the only layer between the two layers, or one or more intervening layers may also be present.

Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
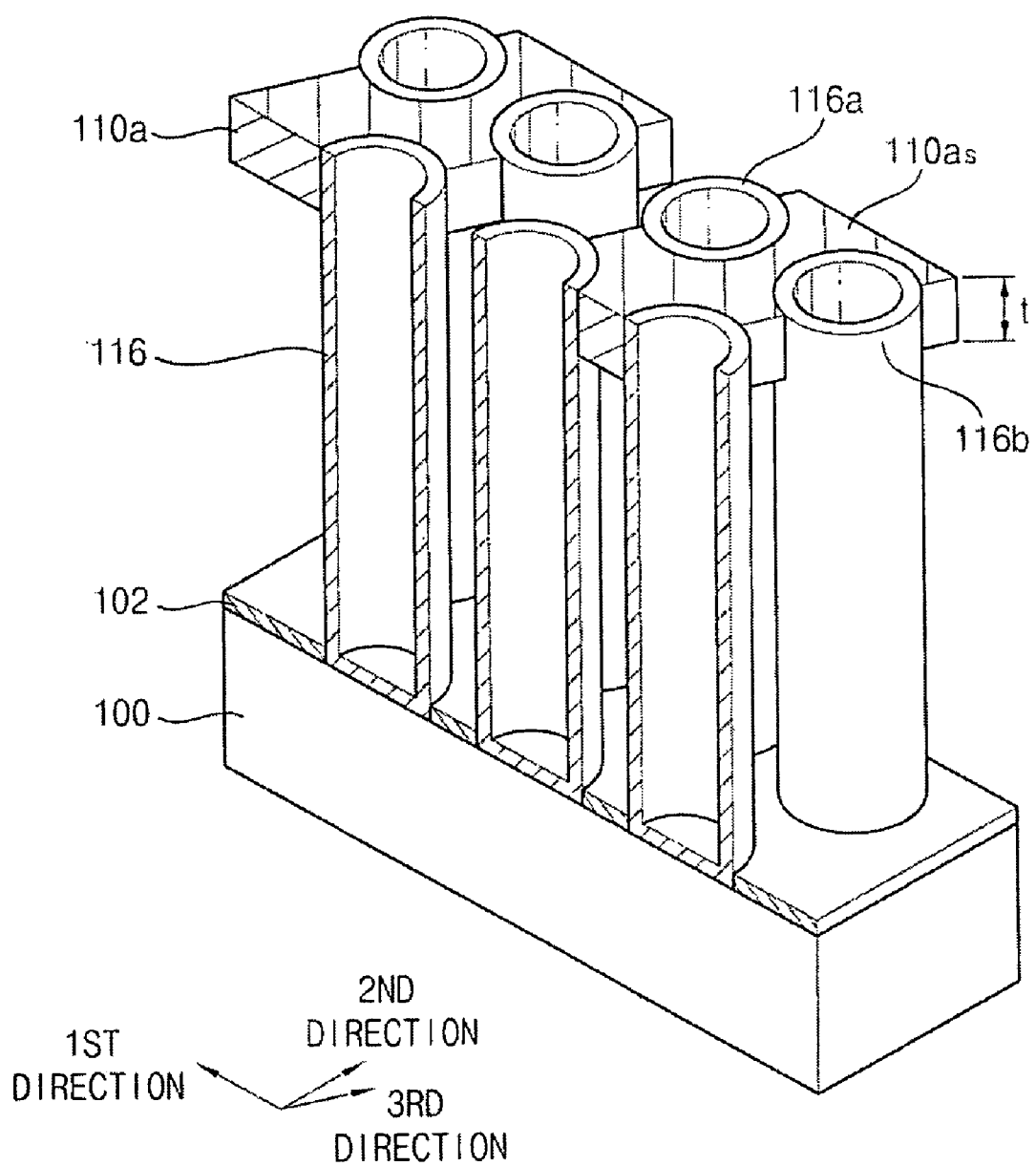
FIG. 2 illustrates a perspective view of lower electrodes and supports of the capacitor structure of FIG. 1.

FIG. 1 illustrates a perspective view of a capacitor structure in accordance with example embodiments. FIG. 2 illustrates a perspective view of lower electrodes relative to a support structure in the capacitor structure of FIG. 1.

Referring to FIGS. 1 and 2, a capacitor structure according to example embodiments may include a plurality of lower electrodes 116, a dielectric layer 130 on the lower electrodes 116, an upper electrode 132 on the dielectric layer 130, and a plurality of supports 110a on the lower electrodes 116.

The lower electrodes 116 may be formed on a substrate 100, and may be electrically connected to a conductive region (not shown) of the substrate 100. As illustrated in FIG. 2, the lower electrodes 116 may have planar top surfaces 116a, e.g., surfaces substantially parallel to a top surface of the substrate 100 and facing away from the substrate 100, so heights of the top surfaces 116a may be substantially the same at any position, e.g., top surfaces 116a of all the lower electrodes 116 may be substantially level. In example embodiments, a plurality of lower electrodes 116 may be arranged in a first direction to define a lower electrode column. In the lower electrode column, the lower electrodes 116 may be arranged at a first distance from each other in the first direction. In example embodiments, a plurality of lower electrode columns may be formed in a second direction perpendicular to the first direction to define a lower electrode matrix. In the lower electrode matrix, the lower electrodes 116 may be arranged at a third distance from each other in a third direction that is at an acute angle to the second direction. For example, as illustrated in FIG. 2, two lower electrode columns may be offset with respect to each other along the first direction, so a lower electrode 116 in one lower electrode column may be oriented along the third direction with respect to an adjacent lower electrode 116 in an adjacent lower electrode column. Alternatively, the lower electrodes 116 may be arranged at a second distance from each other in the second direction.

The lower electrodes 116 may include a metal, a metal nitride, and/or doped polysilicon. For example, the lower electrodes 116 may include one or more of titanium, tantalum, titanium nitride, tantalum nitride, doped polysilicon, etc. When the lower electrodes 116 include metal, the lower electrodes 116 may have a capacitance higher than that of doped polysilicon lower electrodes.

An etch stop layer 102 may be further formed on a portion of the substrate 100 on which the lower electrodes 116 are not formed. The etch stop layer 102 may include silicon nitride.

The supports 110a may be formed on upper sidewalls 116b of the lower electrodes 116, e.g., each support 110a may extend in a plane parallel to a plane of the substrate 100 to contact sidewalls of at least two adjacent lower electrodes 116. Each support 110a may extend in the third direction, and may partially enclose the upper sidewalls of the lower electrodes 116. Alternatively, each support 110a may extend in the second direction, and may partially enclose the upper sidewalls 116b of the lower electrodes 116. The supports 110a may be spaced apart from each other in the first direction. In example embodiments, each support 110a may enclose about half, e.g., along a perimeter, of an upper sidewall of each lower electrode 116.

As illustrated in FIG. 2, the supports 110a may have top surfaces 110a, coplanar with the top surfaces 116a of the lower electrodes 116. For example, each support 110a may have a thickness t, and may extend from the top surfaces 116a of respective lower electrodes 116 to a predetermined distance t along outer sidewalls of the lower electrodes 116, e.g., the upper sidewalls 116b of the lower electrodes 116 may extend from the top surfaces 116a to a distance t in order to directly contact the supports 110a. The supports 110a may include an insulating material. For example, the supports 110a may include silicon nitride.

As illustrated in FIG. 1, the dielectric layer 130 may be formed, e.g., conformally, on the lower electrodes 116, the supports 110a, and the etch stop layer 102. The dielectric layer 130 may include a metal oxide and/or a metal oxynitride having a high dielectric constant. When the lower electrodes 116 include metal, the capacitor structure may have a low leakage current even though the dielectric layer 130 includes a high-k material.

For example, the dielectric layer 130 may include one or more of zirconium oxide, zirconium oxynitride, aluminum oxide, tantalum oxide, hafnium oxide, etc. In example embodiments, the dielectric layer 130 may have a multi-layered structure, e.g., a structure including zirconium oxide layer/aluminum oxide layer/zirconium oxide layer (ZAZ) or zirconium oxide layer/aluminum oxide layer/tantalum oxide layer (ZAT).

Alternatively, when the lower electrodes 116 include doped polysilicon, the dielectric layer 130 may include a low-k material. For example, the dielectric layer 130 may have, e.g., a multi-layered structure including silicon oxide layer/silicon nitride layer/silicon oxide layer (ONO).

The upper electrode 132 may be formed on the dielectric layer 130. The upper electrode 132 may include a metal, a metal nitride, and/or doped polysilicon. When the dielectric layer includes a metal oxide, the upper electrode 132 may include metal and/or metal nitride, thereby reducing the leakage current of the capacitor structure. For example, the upper electrode 132 may include titanium, tantalum, titanium nitride, tantalum nitride. The upper electrode 132 may have a thickness of about several hundred angstroms.

A silicon-germanium layer 134 may be further formed on the upper electrode 132. The silicon-germanium layer 134 may be doped with p-type or n-type impurities.

FIGS. 3A to 12A illustrate perspective views of stages in a method of manufacturing a capacitor structure. FIGS. 3B to 12B illustrate respective top views of the stages in FIGS. 3A to 12A.

Figure 3A:
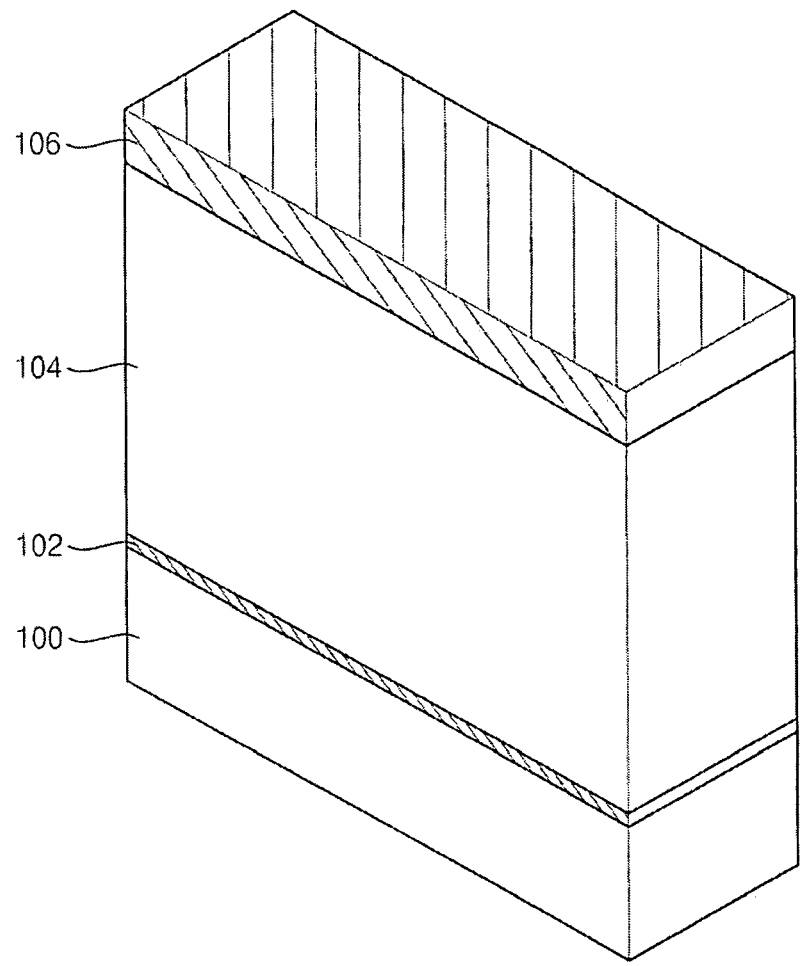
Figure 3B:
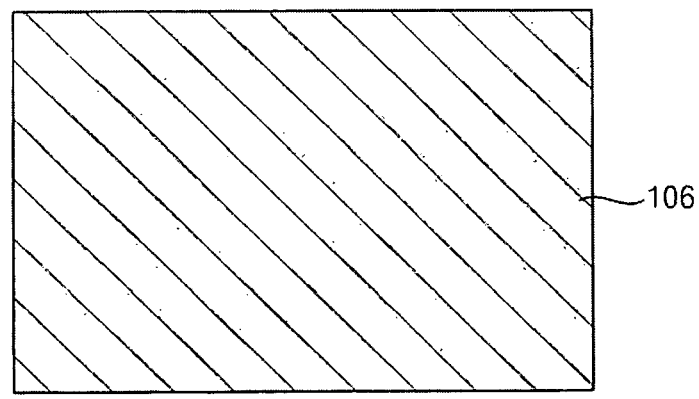

Referring to FIGS. 3A and 3B, the etch stop layer 102 may be formed on the substrate 100. The etch stop layer 102 may be formed using silicon nitride.

A mold layer 104 may be formed on the etch stop layer 102. The mold layer 104 may be formed using silicon oxide. For example, the mold layer 104 may be formed using borophosphor silicate glass (BPSG), tonen silazene (TOSZ), high density plasma chemical vapor deposition (HDP-CVD) oxide, plasma enhanced tetraethylortho silicate (PE-TEOS), etc.

A first sacrificial layer 106 may be formed on the mold layer 104. The first sacrificial layer 106 may be formed to have a thickness equal to or larger than that of the supports 110a (see FIG. 8) formed subsequently.

The first sacrificial layer 106 may be formed using a material having a high etching selectivity with respect to both the mold layer 104 and the supports 110a. The first sacrificial layer 106 may be formed using a material removable by a wet etching process.

For example, the first sacrificial layer 106 may be formed using silicon-germanium or polysilicon. In the present embodiment, the first sacrificial layer 106 may be formed using silicon-germanium by a chemical vapor deposition (CVD) process.

Figure 4A:
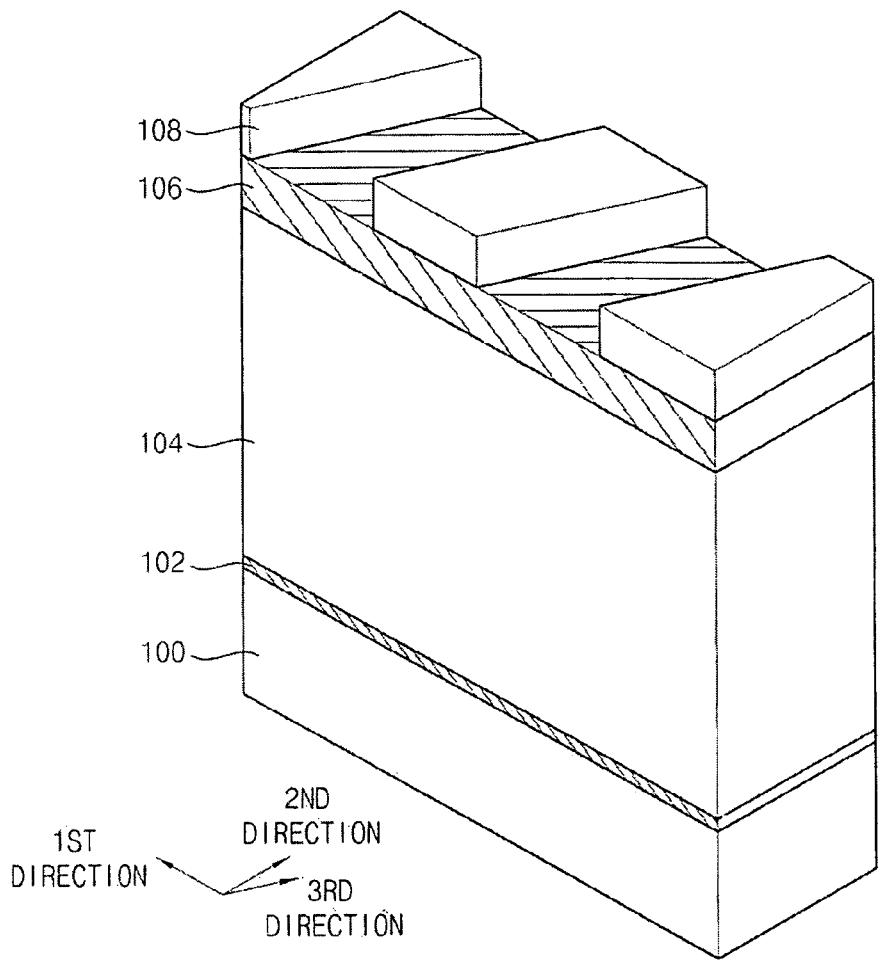
Figure 4B:
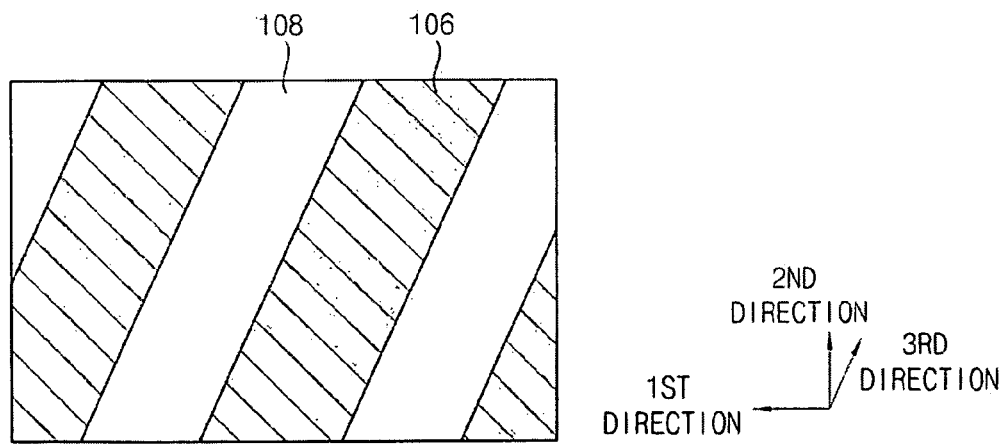

Referring to FIGS. 4A and 4B, a photoresist pattern 108 may be formed on the first sacrificial layer 106. In an example embodiment, the photoresist pattern 108 may have a linear shape extending in the third direction that is at an acute angle to the second direction. The first direction, the second direction, and the third direction may be in the same plane, and the first and second directions may be perpendicular to each other. In another example embodiment, the photoresist pattern 108 may have a linear shape extending in the second direction.

Figure 5A:
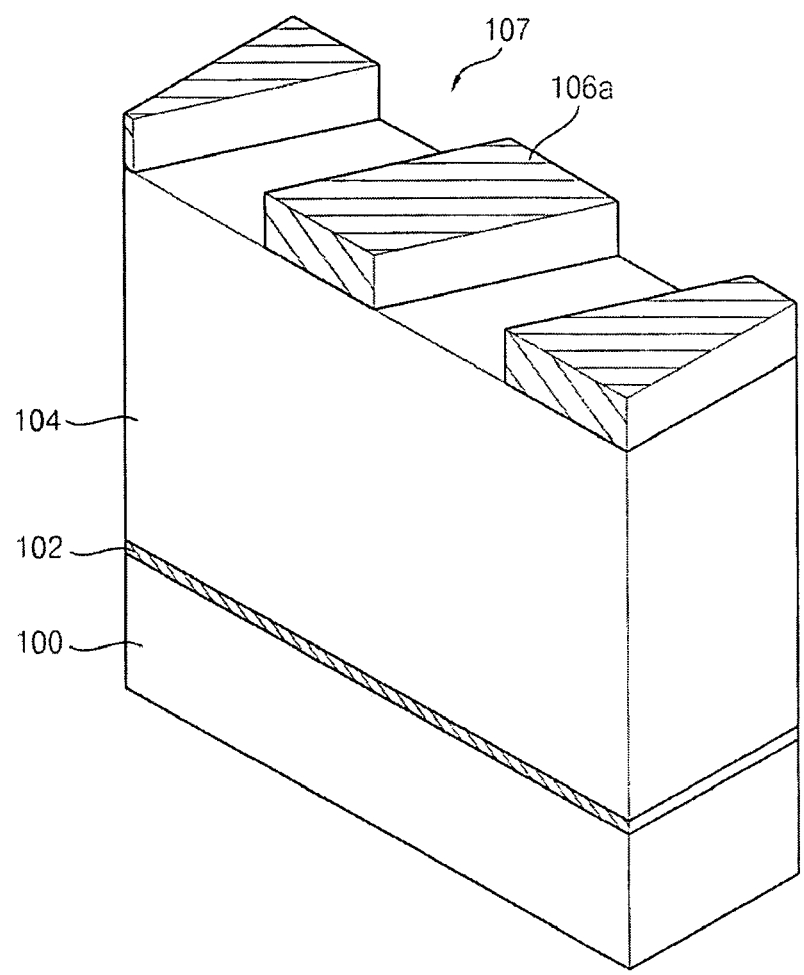
Figure 5B:
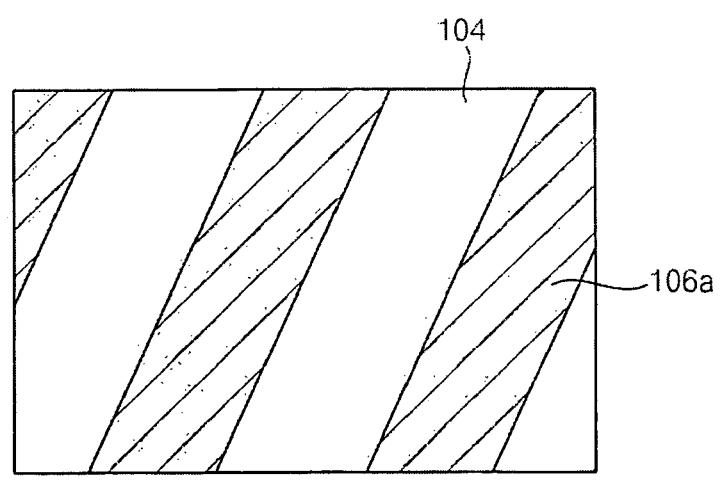

Referring to FIGS. 5A and 5B, the first sacrificial layer 106 may be patterned using the photoresist pattern 108 as an etching mask to form a plurality of first sacrificial layer patterns 106a each of which may extend in the third direction. Alternatively, each first sacrificial layer pattern 106a may extend in the second direction. The photoresist pattern 108 may be removed by an ashing process and/or a stripping process. Spaces between the first sacrificial layer patterns 106a may be referred to as openings 107.

Figure 6A:
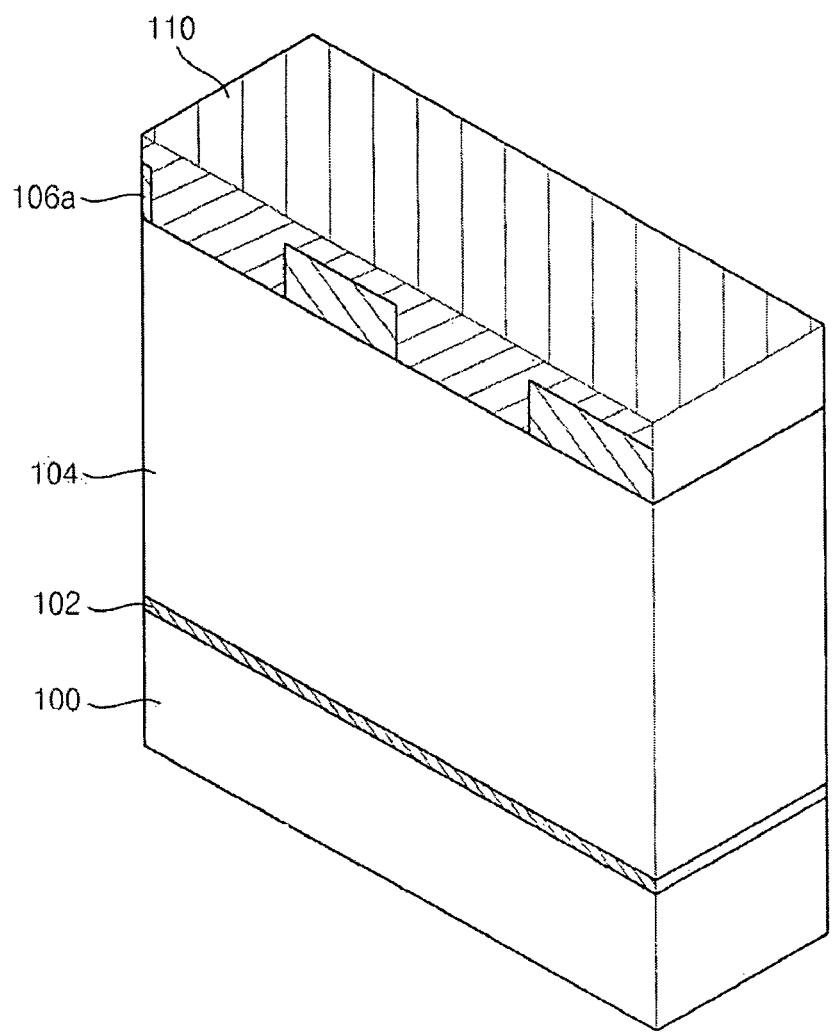
Figure 6B:
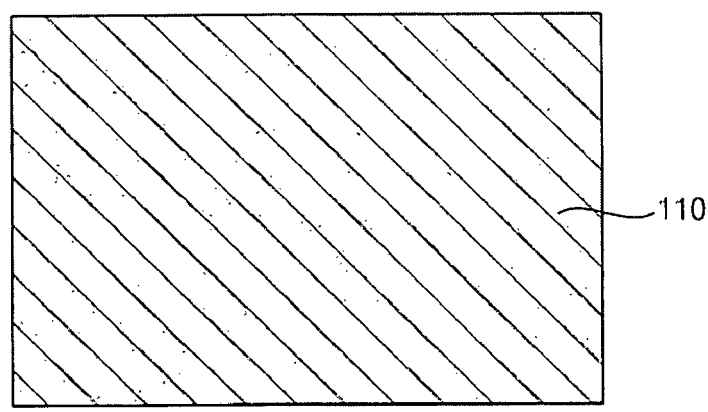

Referring to FIGS. 6A and 6B, a supporting layer 110 may be formed on the mold layer to cover the first sacrificial layer patterns 106a and fill the openings 107. The supporting layer 110 may be formed using an insulating material having a high etching selectivity with respect to the mold layer 104 and the first sacrificial layer patterns 106a. For example, the supporting layer 110 may be formed using silicon nitride.

Figure 7A:
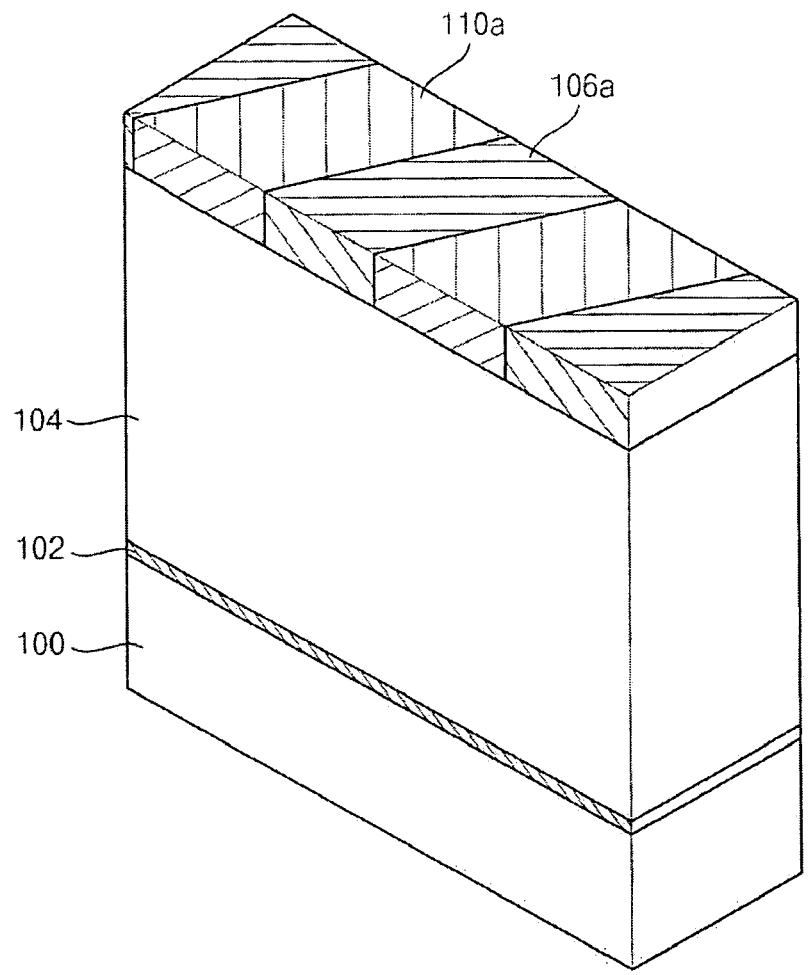
Figure 7B:
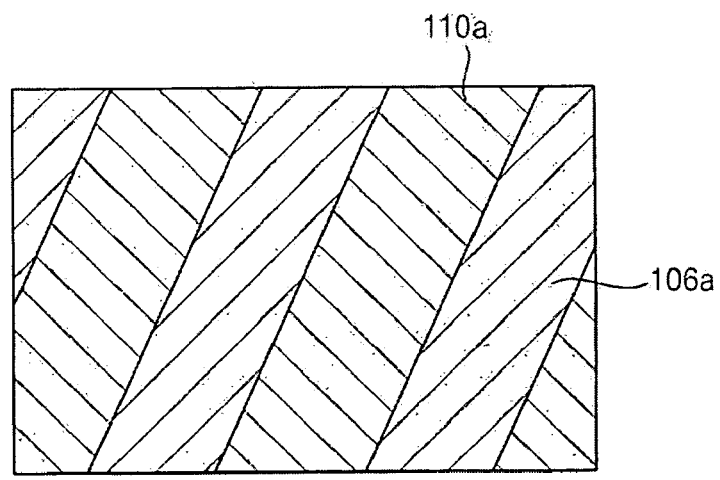

Referring to FIGS. 7A and 7B, an upper portion of the supporting layer 110 may be planarized until top surfaces of the first sacrificial layer patterns 106a are exposed to define a plurality of the supports 110a, each of which may extend in the third direction. Alternatively, each support 110a may extend in the second direction. The planarization process may be performed by a chemical mechanical polishing (CMP) process and/or an etch back process.

Figure 8A:
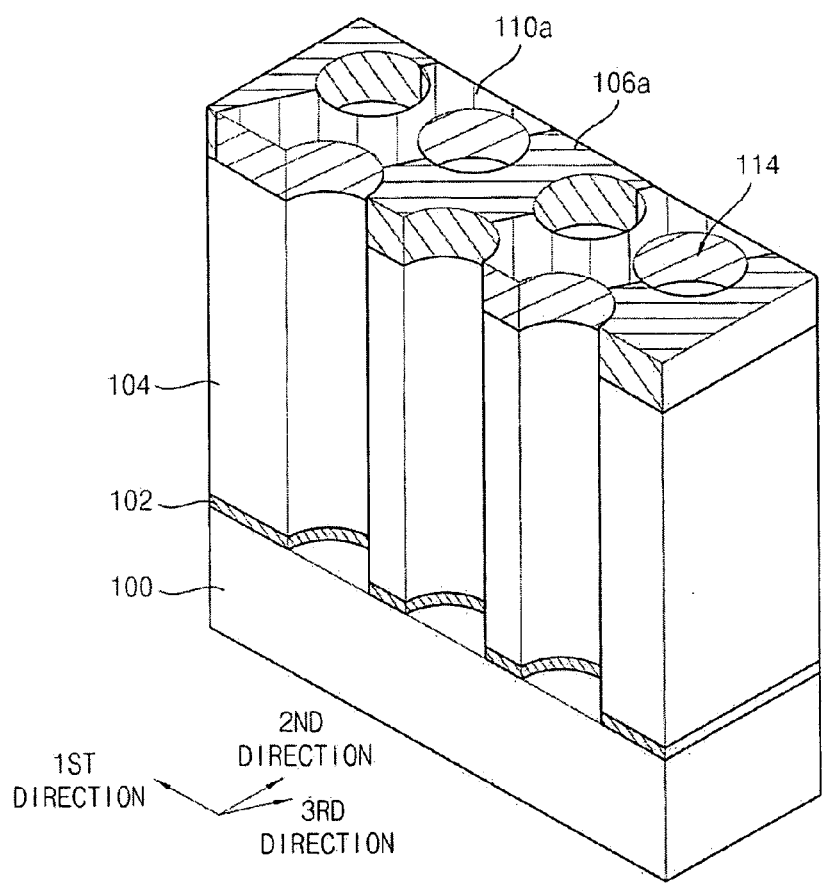
Figure 8B:
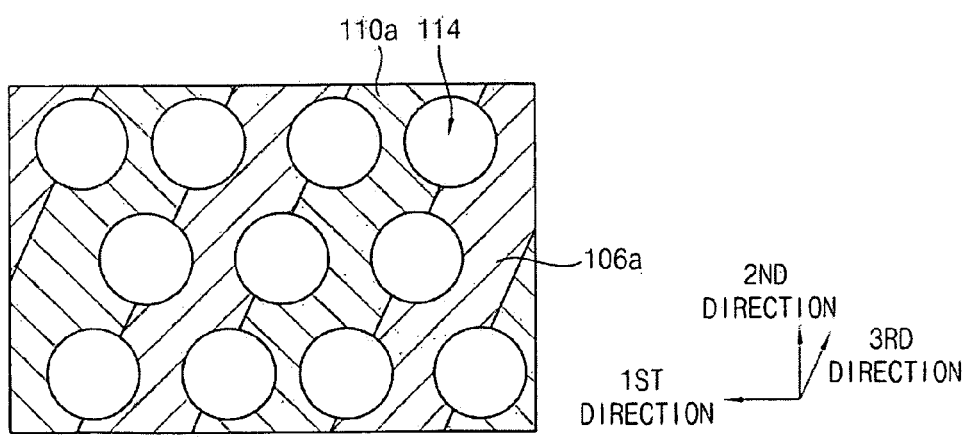

Referring to FIGS. 8A and 8B, the supports 110a, the first sacrificial layer patterns 106a, the mold layer 104, and the etch stop layer 102 may be partially removed to form a plurality of holes 114 therethrough exposing portions of the top surface of the substrate 100. The holes 114 may be formed by a photolithography process.

In example embodiments, the holes 114 may be formed at a first distance from each other in the first direction, and may be referred to as a hole column. In example embodiments, a plurality of hole columns may be formed in the second direction, and may be referred to as a hole matrix. In the hole matrix, the holes 114 may be arranged at a third distance from each other in the third direction, when each support 110a extends in the third direction. Alternatively, the holes 114 may be arranged at a second distance from each other in the second direction, when each support 110a extends in the second direction. For example, each of the holes 114 may be formed at an interface between the supports 110a and respective first sacrificial layer patterns 106a, e.g., the support 110a may surround one portion of the hole 114 and an adjacent sacrificial layer pattern 106a may surround another portion of the hole 114.

Figure 9A:
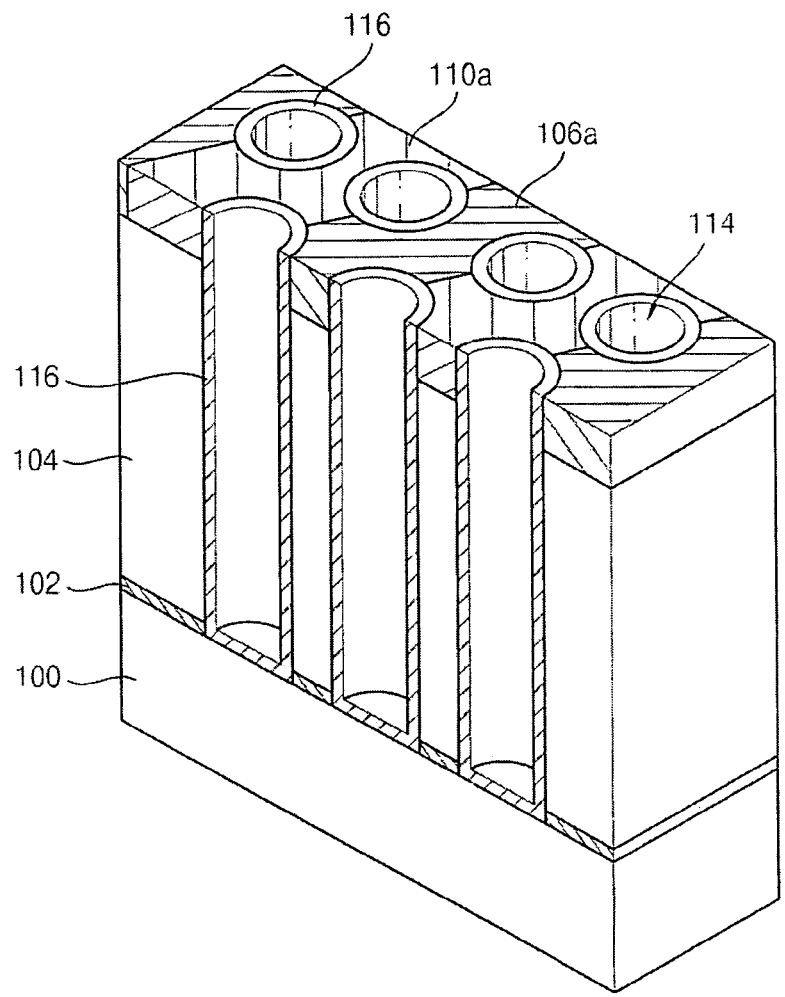
Figure 9B:
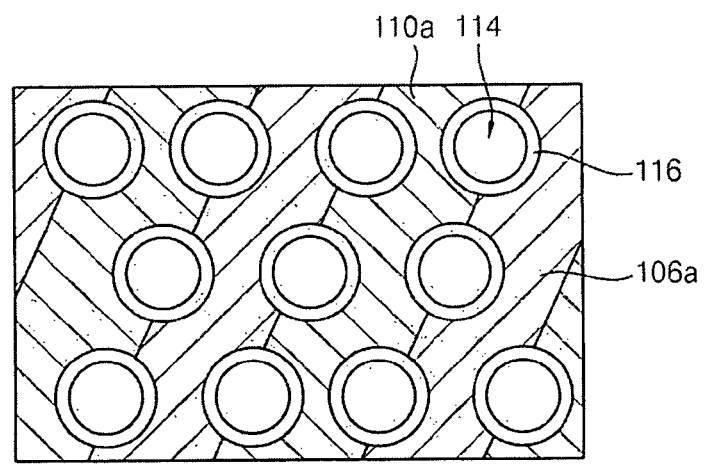

Referring to FIGS. 9A and 9B, a lower electrode layer may be formed on the exposed top surfaces of the substrate 100, inner walls of the holes 114, the supports 110a, and the first sacrificial layer patterns 106a. In example embodiments, the lower electrode layer may not completely fill the holes 114 and may be formed conformally thereon. The lower electrode layer may be formed by a CVD process, a physical vapor deposition (PVD) process, or an atomic layer deposition (ALD) process.

The lower electrode layer may be formed using a metal, a metal nitride, and/or doped polysilicon. For example, the lower electrode layer may be formed using titanium, tantalum, aluminum, titanium nitride, tantalum nitride, aluminum nitride, etc.

An upper portion of the lower electrode layer on the supports 110a and the first sacrificial layer patterns 106a may be removed by a CMP process and/or an etch back process. Thus, a plurality of lower electrodes 116, each of which may have a cylindrical shape, may be formed in the holes 114, i.e., on inner sidewalls of the holes 114.

Figure 10A:
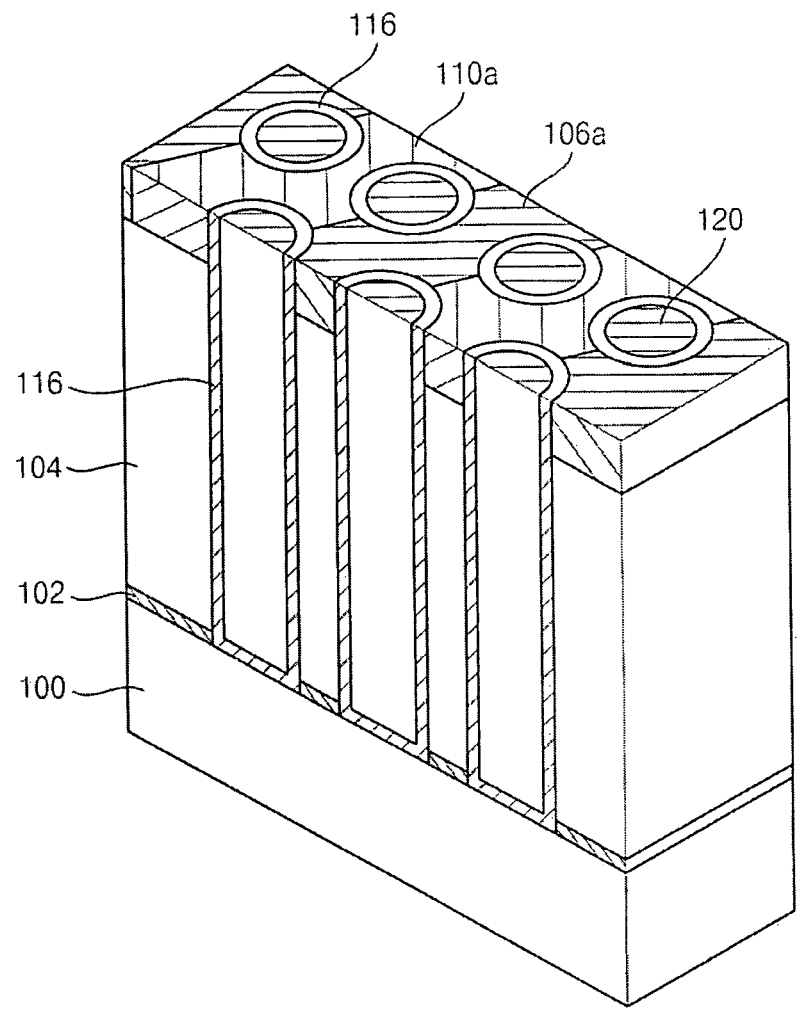
Figure 10B:
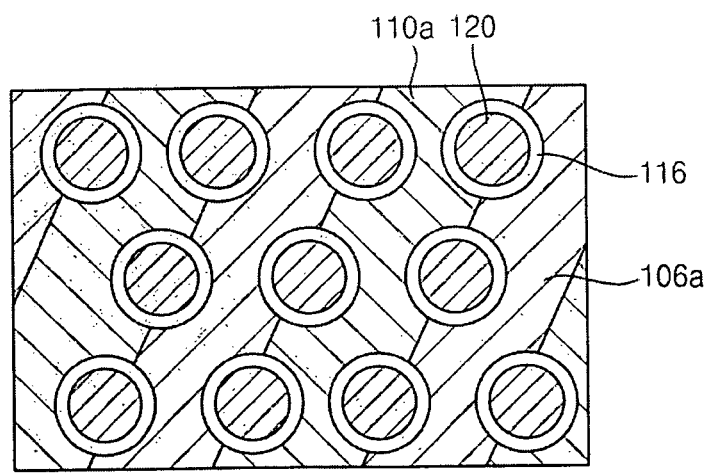

Referring to FIGS. 10A and 10B, a second sacrificial layer may be formed on the lower electrodes 116, the supports 110a, and the first sacrificial layer patterns 106a to fill the remaining portions of the holes 114. The second sacrificial layer may be formed using a material substantially the same as that of the mold layer 104. For example, the second sacrificial layer may be formed using silicon oxide by a CVD process or an ALD process. An upper portion of the second sacrificial layer may be removed by a CMP process and/or an etch back process to form a plurality of second sacrificial layer patterns 120 in the holes 114.

Alternatively, the second sacrificial layer may be formed using a photoresist composition. In this case, when the second sacrificial layer patterns 120 are subsequently removed, the removal may be performed by an ashing process and/or a stripping process.

Figure 11A:
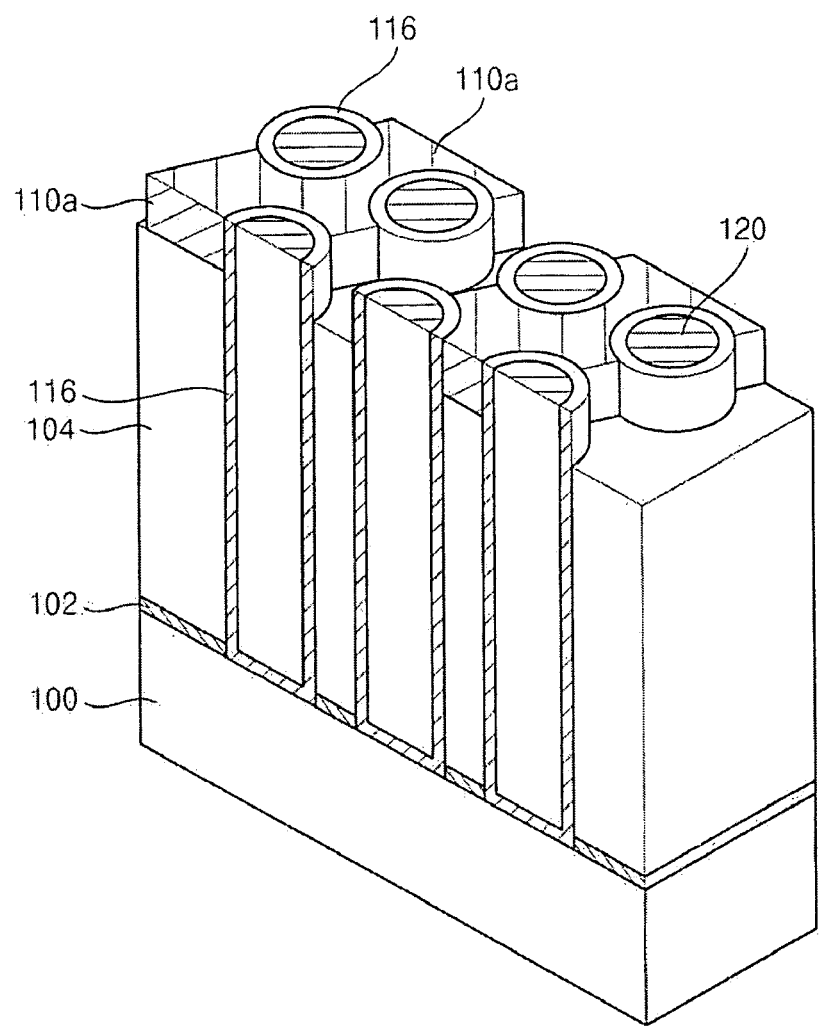
Figure 11B:
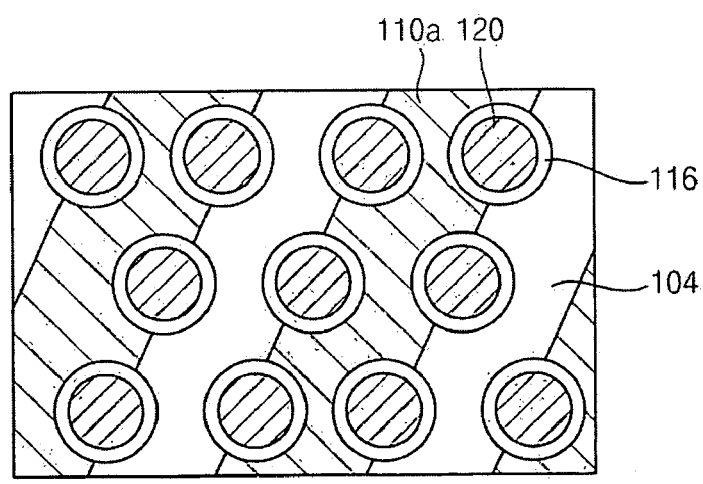

Referring to FIGS. 11A and 11B, the first sacrificial layer patterns 106a may be removed by a wet etching process. It is noted that if the first sacrificial layer patterns 106a are removed by a dry etching process using plasma, the lower electrodes 116 and the supports 110a may be damaged.

Figure 12A:
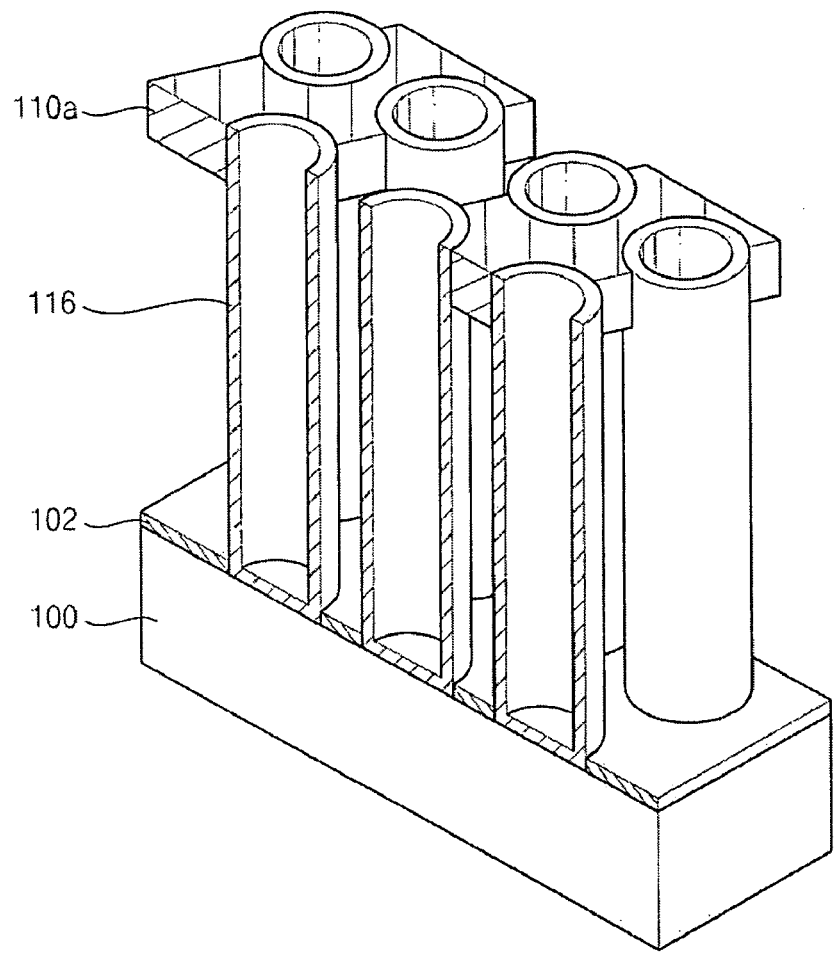
Figure 12B:
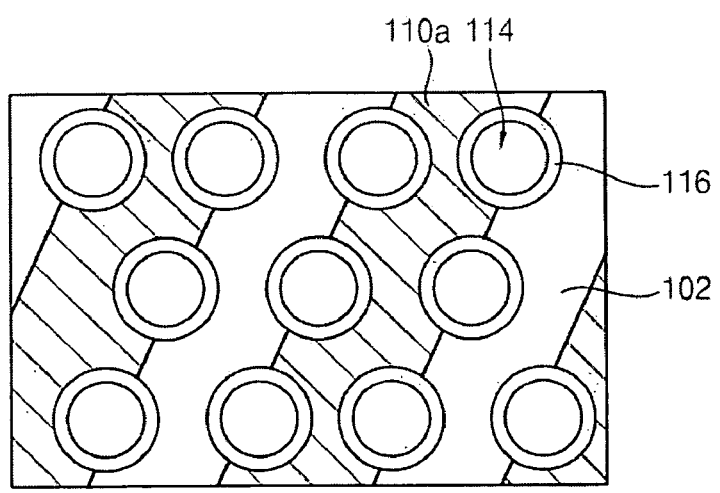

Referring to FIGS. 12A and 12B, the mold layer 104 and the second sacrificial layer patterns 120 may be removed, e.g., by a wet etching process, to expose inner sidewalls and outer sidewalls of the lower electrodes 116. Therefore, as illustrated in FIG. 12A, after removal of the mold layer 104 and the second sacrificial layer patterns 120, the lower electrode 116 may remain on the substrate 110 with the supports 110a connecting therebetween, e.g., each support 110a may connect at least two adjacent lower electrodes 116.

When the mold layer 104 and the second sacrificial layer patterns 120 include substantially the same material, the removal may be performed by one etching process. When the mold layer 104 and the second sacrificial layer patterns 120 include different materials, the removal may be performed by two etching processes.

In example embodiments, the supports 110a may be formed before forming the lower electrodes 116. Additionally, the first sacrificial layer patterns 106a for forming the supports 110a may be removed by a wet etching process. Thus, the lower electrodes 116 may not be damaged when the supports 110a are formed, and may have a planar top surface and a height substantially the same at any position.

In contrast, if supports are formed after forming lower electrodes, the lower electrodes may be damaged when the supports are formed. Thus, capacitors having such lower electrodes may have a high leakage current and/or a low capacitance.

Referring to FIG. 1 again, the dielectric layer 130 may be formed on the lower electrodes 116, the supports 110a, and the etch stop layer 102. The dielectric layer 130 may be formed using a metal oxide and/or a metal oxynitride having a high dielectric constant. The dielectric layer 130 may be formed by a CVD process or an ALD process. For example, the dielectric layer 130 may be formed using zirconium oxide, zirconium oxynitride, aluminum oxide, tantalum oxide, hafnium oxide, etc. These may be used alone or in a combination thereof. In example embodiments, the dielectric layer 130 may be formed to have a multi-layered structure including zirconium oxide layer/aluminum oxide layer/zirconium oxide layer (ZAZ) or zirconium oxide layer/aluminum oxide layer/tantalum oxide layer (ZAT).

Alternatively, when the lower electrodes 116 include doped polysilicon, the dielectric layer 130 may be formed using a low-k material. For example, the dielectric layer 130 may be formed to have, e.g., a multi-layered structure including silicon oxide layer/silicon nitride layer/silicon oxide layer (ONO).

The upper electrode 132 may be formed on the dielectric layer 130. The upper electrode 132 may be formed using a metal, a metal nitride, and/or doped polysilicon. For example, the upper electrode 132 may be formed using titanium, tantalum, titanium nitride, tantalum nitride. The upper electrode 132 may be formed by a CVD process, a PVD process, or an ALD process. The upper electrode 132 may be formed to have a thickness of about several hundred angstroms. A silicongermanium layer 134 doped with impurities may be further formed on the upper electrode 132.

FIGS. 13A to 15A illustrate perspective views of stages in a method of manufacturing a capacitor structure according to another embodiment. FIGS. 13B to 15B illustrate respective top views of the stages in FIGS. 13A to 15A.

Figure 13A:
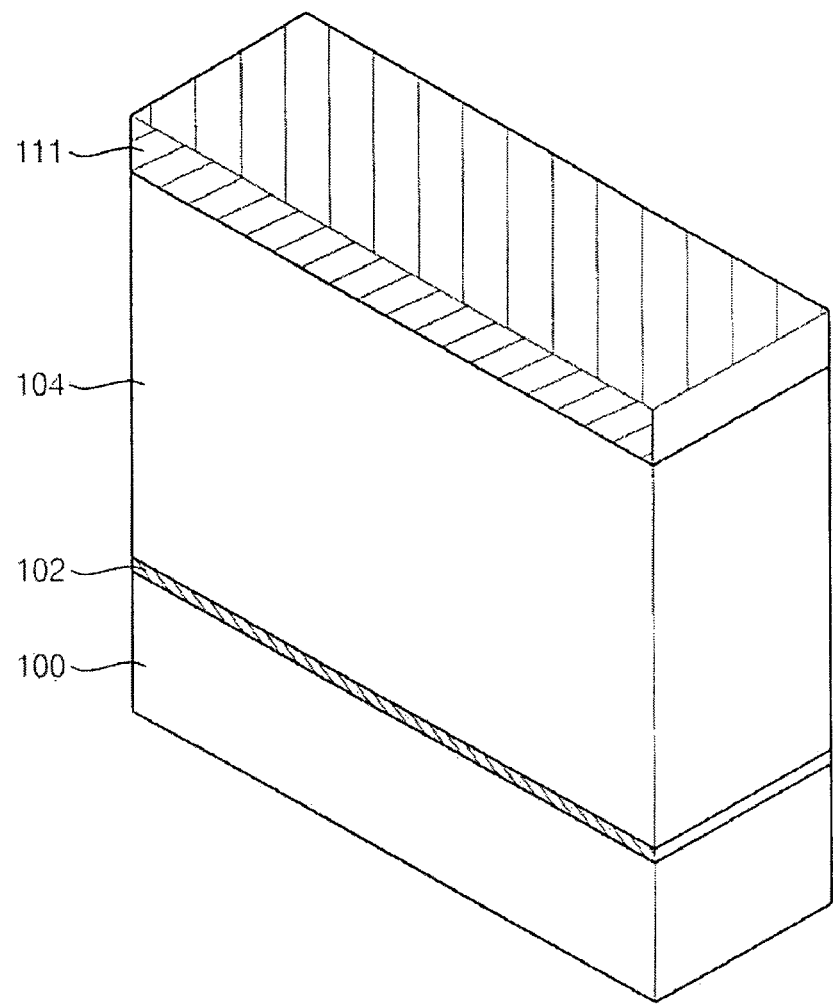
Figure 13B:
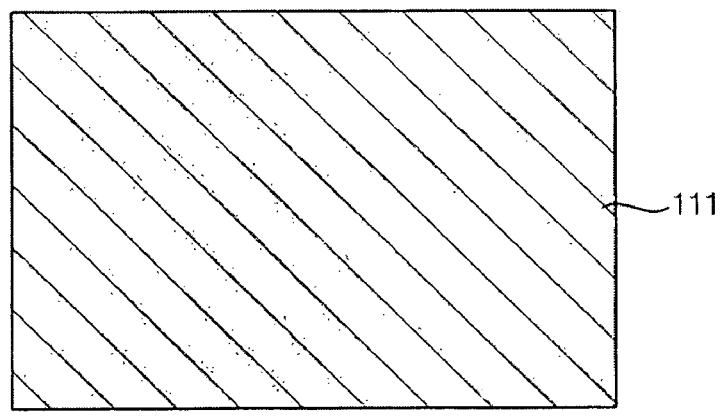

Referring to FIGS. 13A and 13B, the etch stop layer 102 may be formed on the substrate 100. The etch stop layer 102 may be formed using silicon nitride. The mold layer 104 may be formed on the etch stop layer 102, e.g., using silicon oxide. For example, the mold layer 104 may be formed using borophosphor silicate glass (BPSG), tonen silazene (TOSZ), high density plasma chemical vapor deposition (HDP-CVD) oxide, plasma enhanced tetraethylortho silicate (PE-TEOS), etc.

A supporting layer 111 may be formed on the mold layer 104. The supporting layer 111 may be formed using an insulating material having a high etching selectivity with respect to the mold layer 104. For example, the supporting layer 111 may be formed using silicon nitride.

Figure 14A:
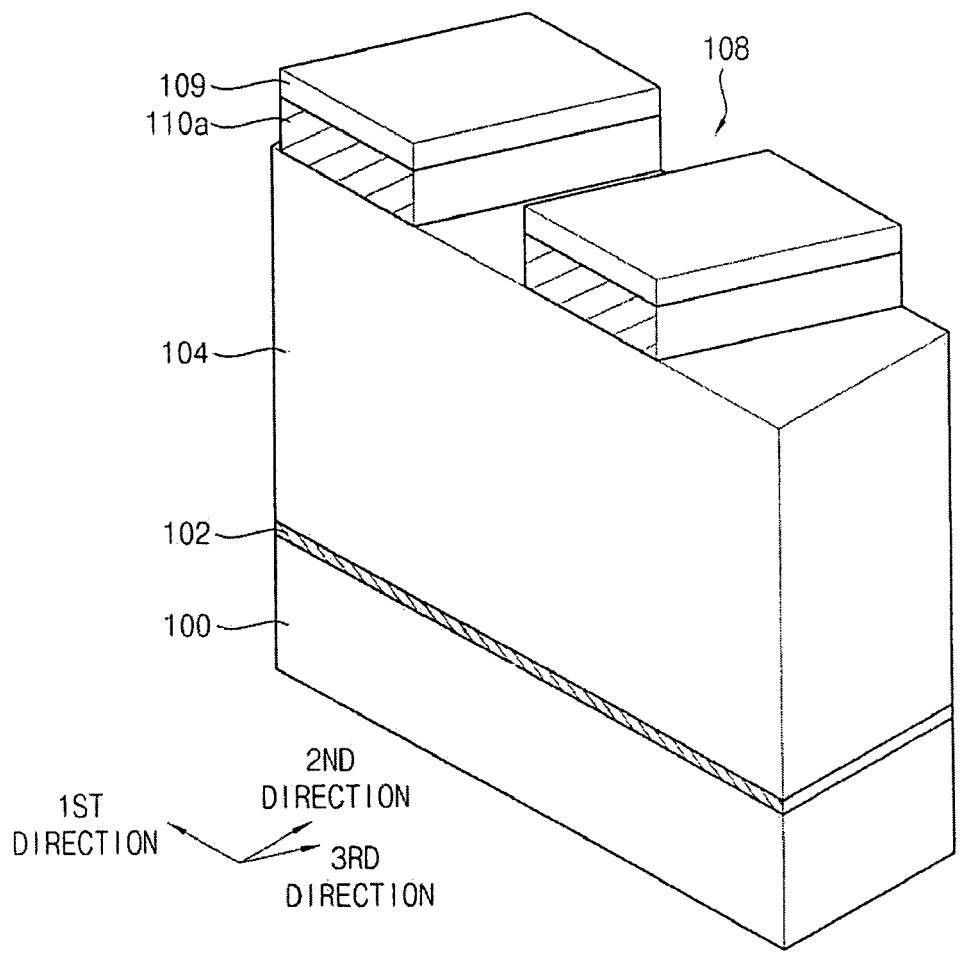
Figure 14B:
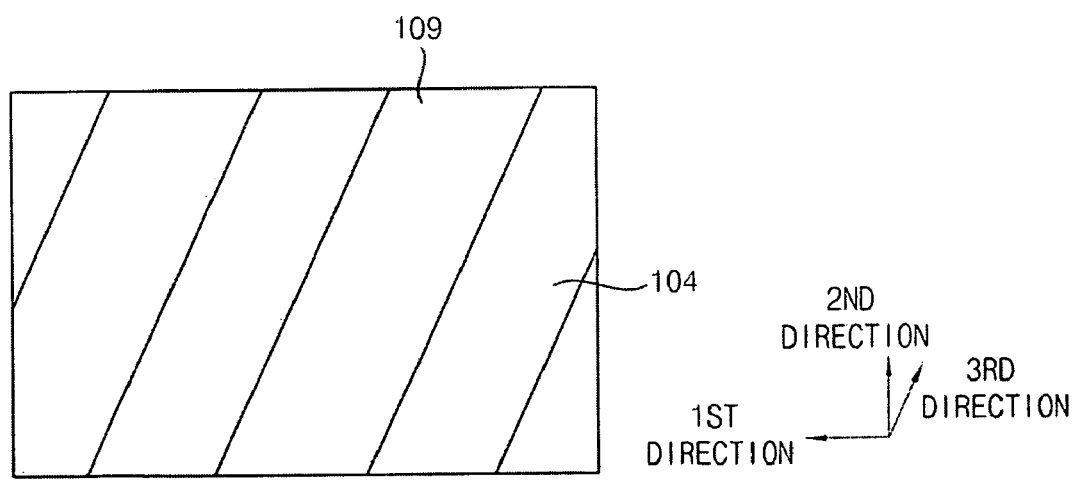

Referring to FIGS. 14A and 14B, a photoresist pattern 109 may be formed on the supporting layer 111. In an example embodiment, the photoresist pattern 109 may have a linear shape extending in the third direction that is at an acute angle to the second direction. The first direction, the second direction, and the third direction may be in the same plane, and the first and second directions may be perpendicular to each other. In another example embodiment, the photoresist pattern 109 may have a linear shape extending in the second direction.

The supporting layer 111 may be patterned using the photoresist pattern 109 as an etching mask to form a plurality of the supports 110a, each of which may extend in the third direction. Alternatively, each support 110a may extend in the second direction. The photoresist pattern 109 may be removed by an ashing process and/or a stripping process. Spaces between the supports 110a may be referred to as openings 108.

Figure 15A:
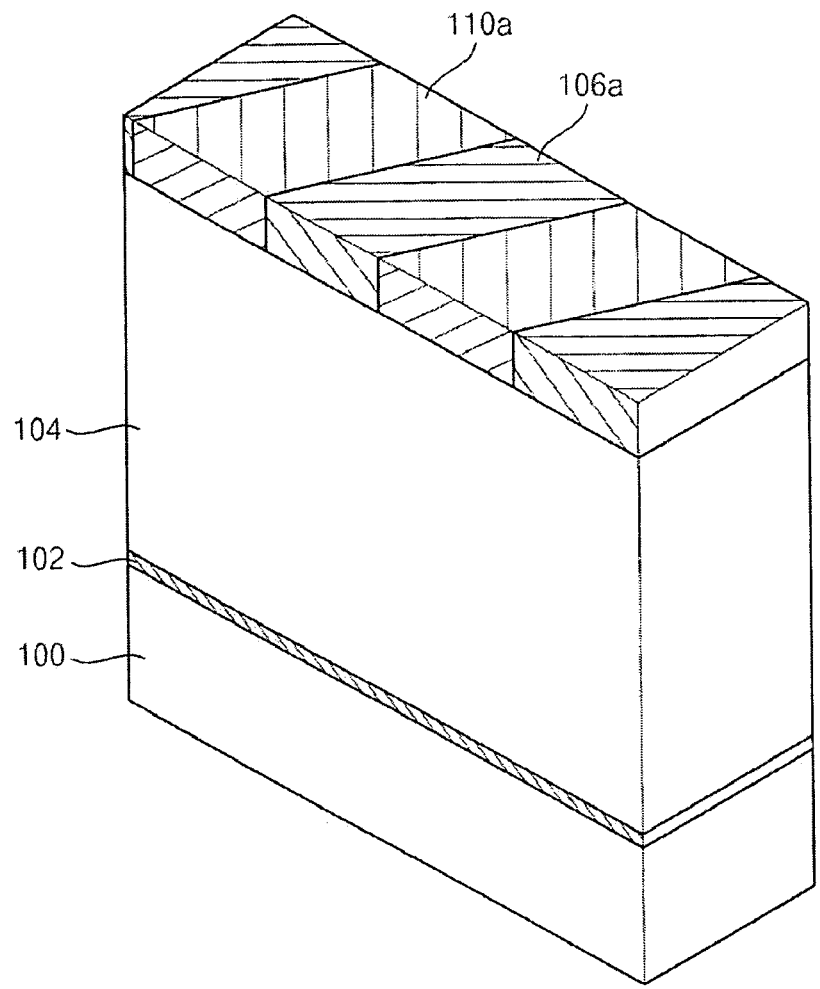
Figure 15B:
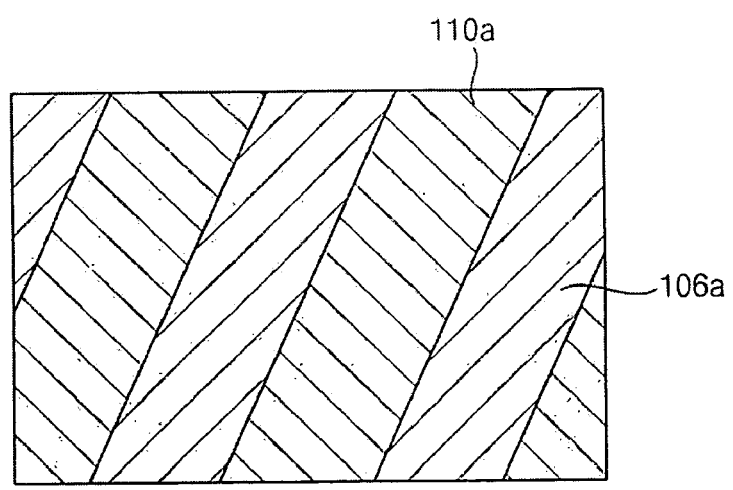

Referring to FIGS. 15A and 15B, a first sacrificial layer may be formed on the mold layer 104 to cover the supports 110a and fill the openings 108. The first sacrificial layer may be formed using a material having a high etching selectivity with respect to both the mold layer 104 and the supports 110a. The first sacrificial layer may be formed using a material removable by a wet etching process. For example, the first sacrificial layer may be formed using silicon-germanium or polysilicon. In the present embodiment, the first sacrificial layer may be formed using silicon-germanium by a CVD process.

An upper portion of the first sacrificial layer may be planarized until a top surface of the supports 110a is exposed to form a plurality of first sacrificial layer patterns 106a, each of which may extend in the third direction. Alternatively, each first sacrificial layer pattern 106a may extend in the second direction. The planarization process may be performed by a chemical mechanical polishing (CMP) process and/or an etch back process.

Processes substantially the same as or similar to those illustrated with reference to FIGS. 8A to 12A and 8B to 12B may be performed to form the capacitor structure.

FIGS. 16A to 18A illustrate perspective views of stages in a method of manufacturing a capacitor structure according to another embodiment. FIGS. 16B to 18B illustrate respective top views of the stages in FIGS. 16A to 18A.

First, processes substantially the same as or similar to those described previously with reference to FIGS. 3A to 8A and 3B to 8B may be performed to form a plurality of holes 114 exposing top surfaces of the substrate 100.

Figure 16A:
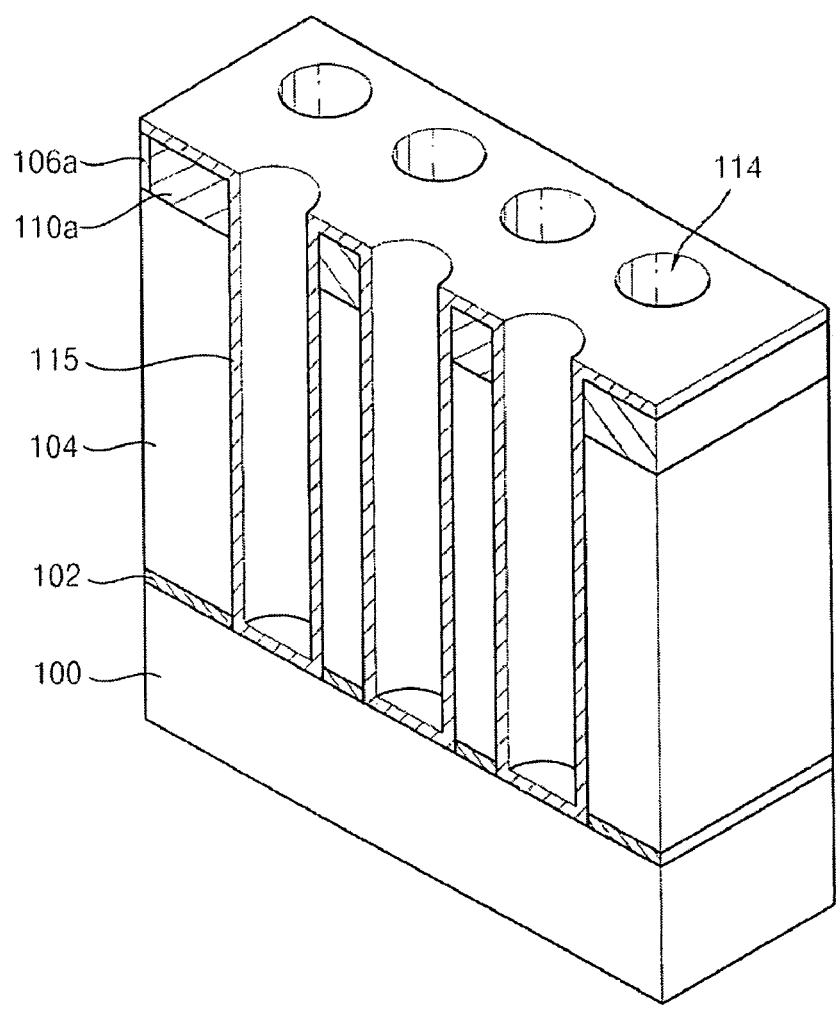
Figure 16B:
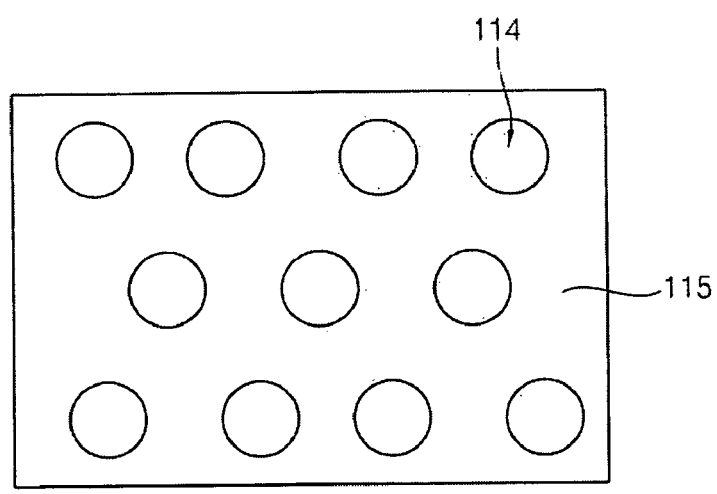

Next, referring to FIGS. 16A and 16B, a lower electrode layer 115 may be formed on the exposed top surfaces of the substrate 100, inner walls of the holes 114, the supports 110a, and the first sacrificial layer patterns 106a. In example embodiments, the lower electrode layer 115 may not completely fill the holes 114, e.g., may be formed conformally thereon. The lower electrode layer 115 may be formed by a CVD process, a PVD process, or an ALD process.

The lower electrode layer 115 may be formed using a metal, a metal nitride, and/or doped polysilicon. For example, the lower electrode layer 115 may be formed using titanium, tantalum, aluminum, titanium nitride, tantalum nitride, aluminum nitride, etc.

Figure 17A:
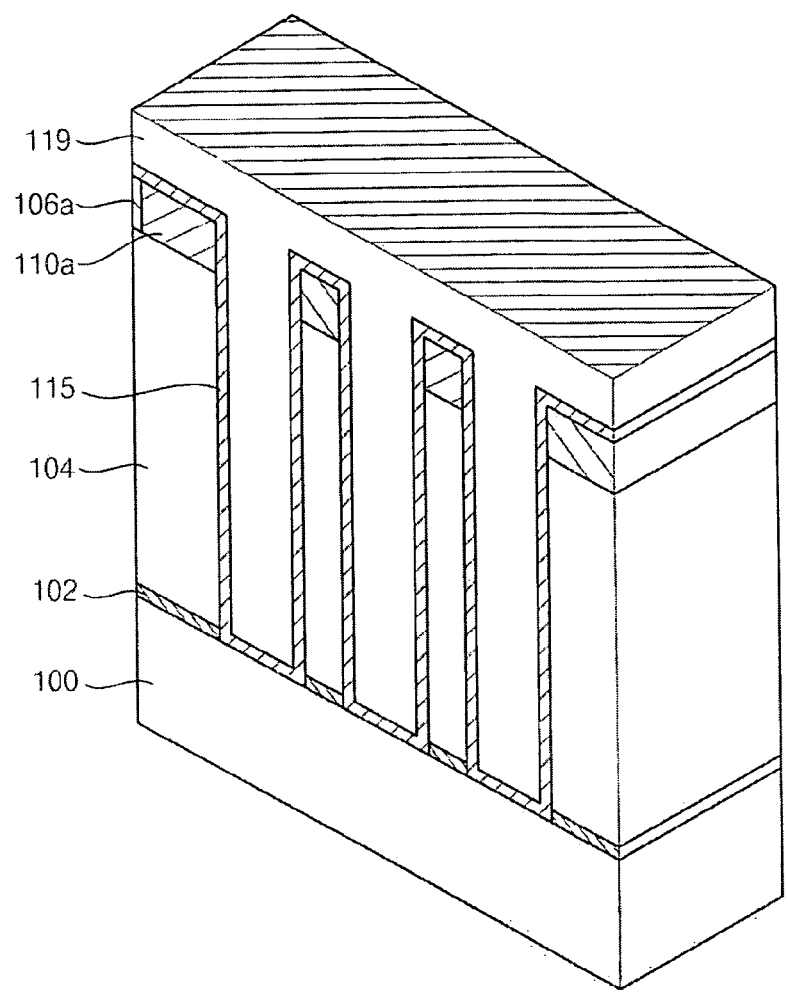
Figure 17B:
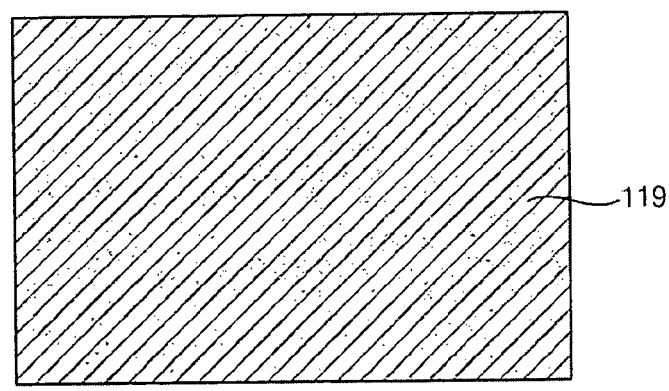

Referring to FIGS. 17A and 17B, a second sacrificial layer 119 may be formed on the lower electrode layer 115 to fill the remaining portion of the holes 114. The second sacrificial layer 119 may be formed using silicon oxide.

Figure 18A:
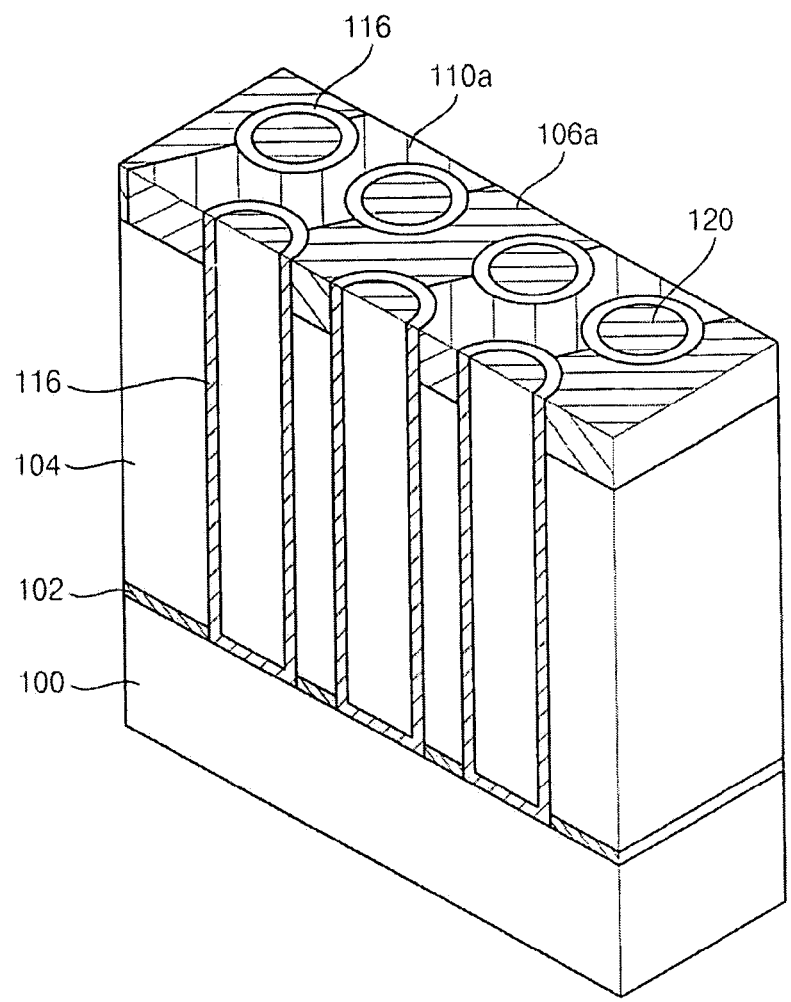
Figure 18B:
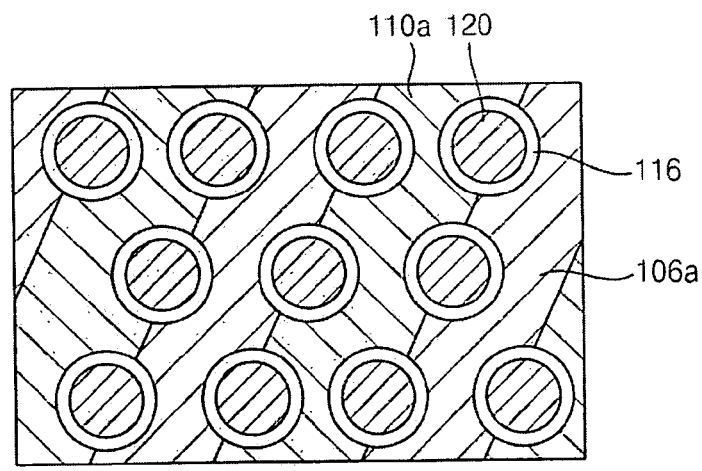

Referring to FIGS. 18A and 18B, an upper portion of the second sacrificial layer 119 may be removed until a top surface of the second sacrificial layer 115 is exposed, thereby forming a plurality of second sacrificial layer patterns 120 in the holes 114. The removal thereof may be performed by a CMP process and/or an etch back process. Additionally, an upper portion of the lower electrode layer 115 on the supports 110a and the first sacrificial layer patterns 106a may be removed by a CMP process and/or an etch back process. Thus, a plurality of lower electrodes 116 each of which may have a cylindrical shape may be formed in the holes 114.

Processes substantially the same as or similar to those illustrated with reference to FIGS. 11A to 12A and 11B to 12B may be performed to manufacture the capacitor structure.

Figure 19A:
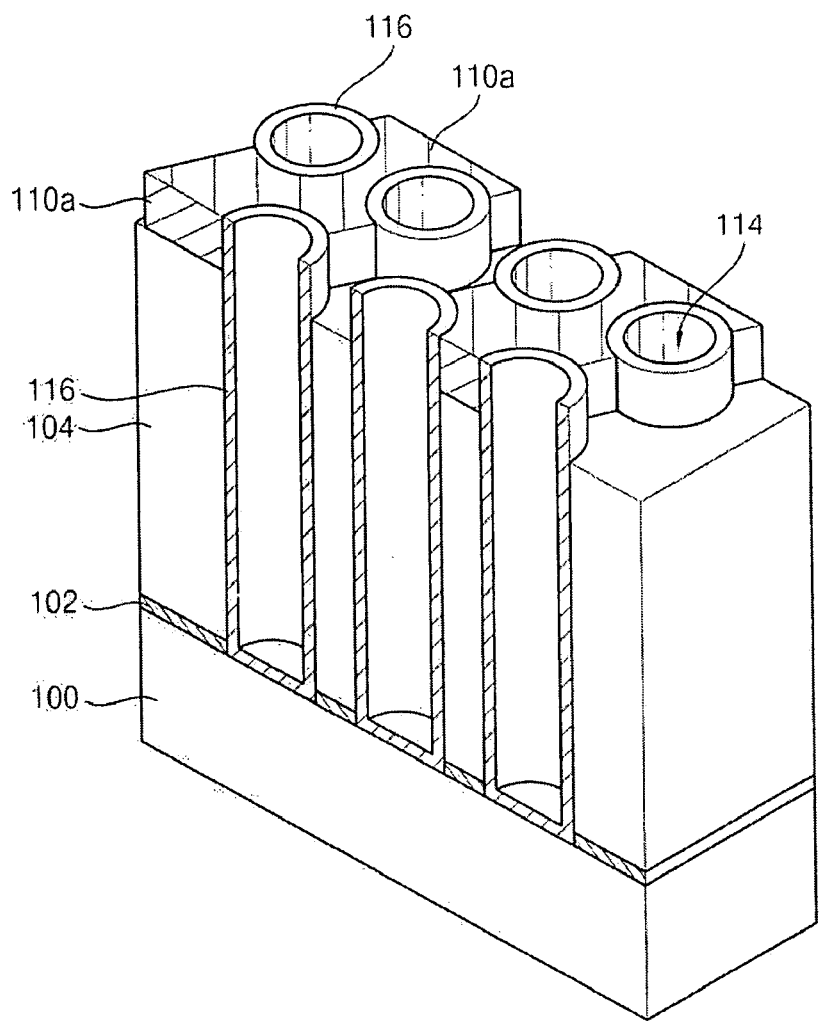
FIG. 19A illustrates a perspective view of a method of manufacturing a capacitor structure according to other example embodiments.
Figure 19B:
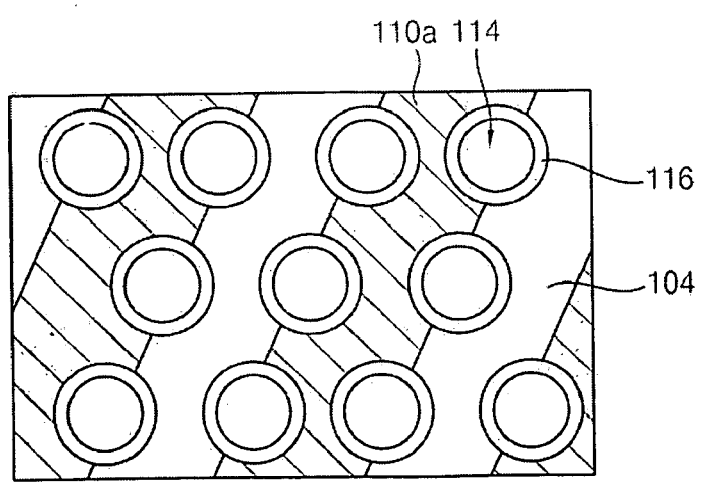
FIG. 19B illustrates a top view of the method in FIG. 19A.

FIG. 19A illustrates a perspective view of a method of manufacturing a capacitor structure. FIG. 19B illustrates a top view of FIG. 19A.

First, processes substantially the same as or similar to those illustrated with reference to FIGS. 3A to 9A and 3B to 9B may be performed to form a plurality of lower electrodes 116 in the holes 114. Next, referring to FIGS. 19A and 19B, the first sacrificial layer pattern 106a may be removed, e.g., by a wet etching process.

In the present embodiment, a sacrificial layer filling the holes 114 may not be formed. The mold layer 104 may be removed to expose inner sidewalls and outer sidewalls of the lower electrodes 116. The mold layer 104 may be removed by a wet etching process. Next, processes substantially the same as or similar to those illustrated with reference to FIG. 1 may be performed to manufacture the capacitor structure.

Figure 20:
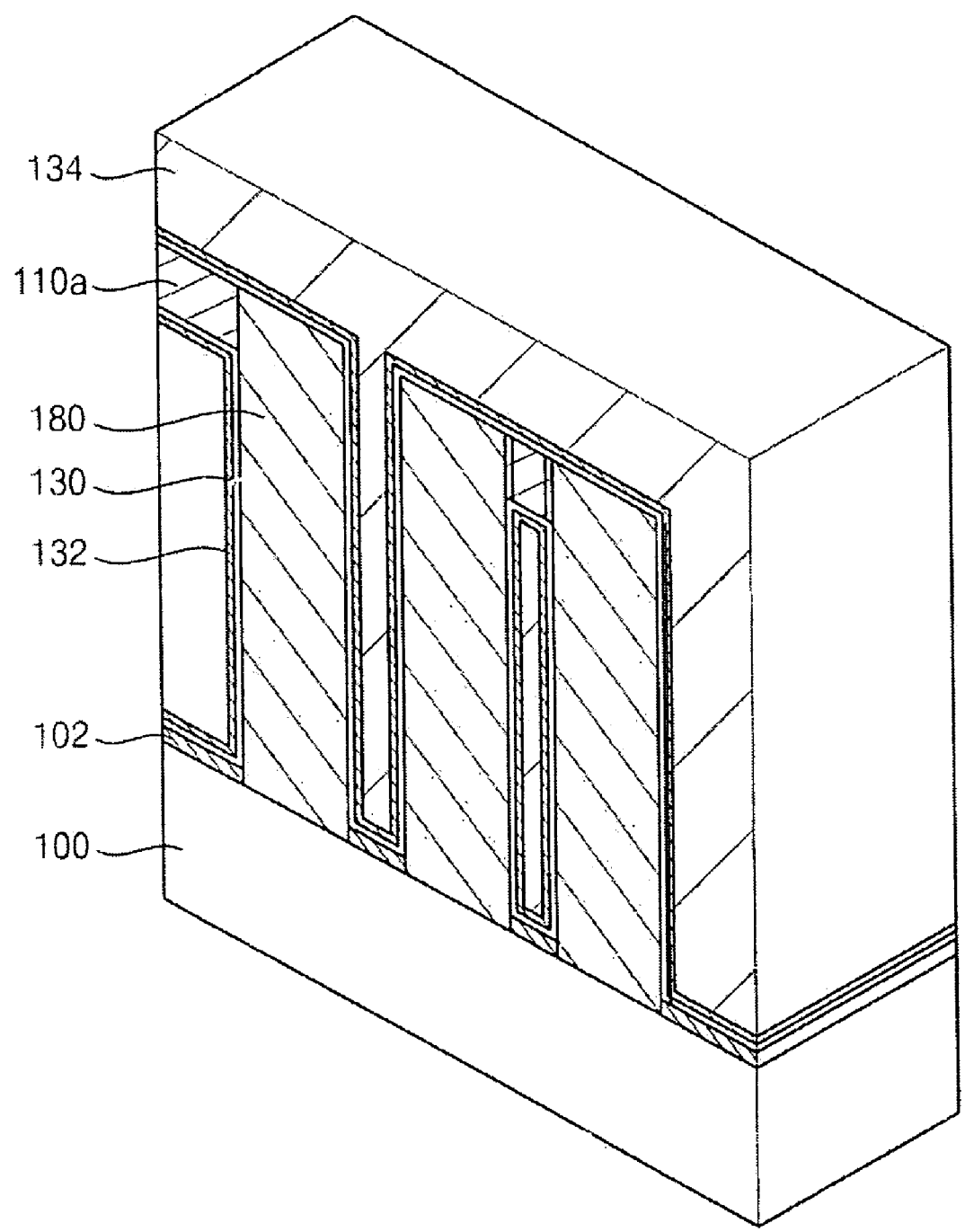
FIG. 20 illustrates a perspective view of a capacitor structure according to other example embodiments.
Figure 21:
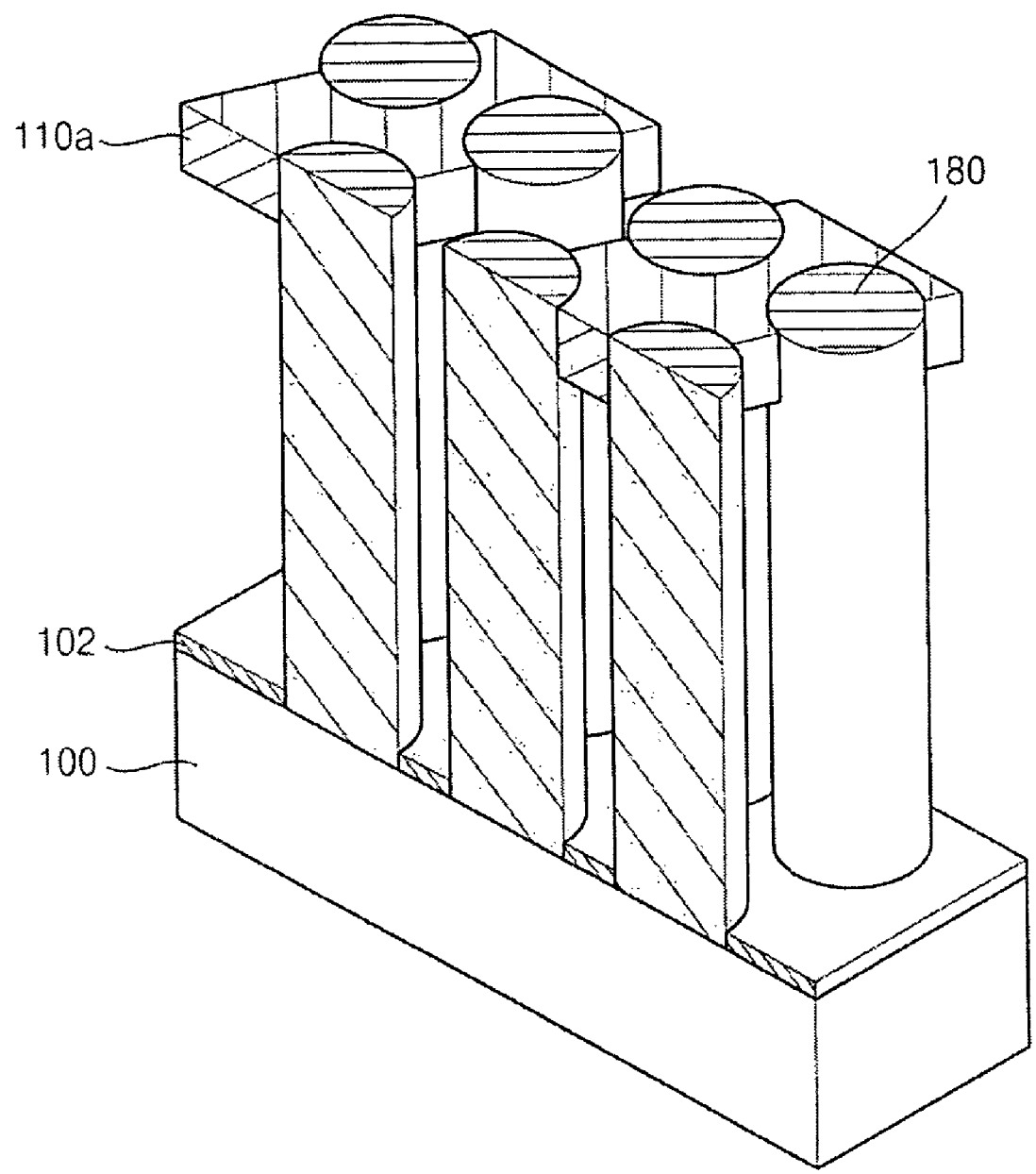
FIG. 21 illustrates a perspective view of lower electrodes and supports of the capacitor structure of FIG. 20.

FIG. 20 illustrates a perspective view of a capacitor structure in accordance with another example embodiment. FIG. 21 illustrates a perspective view of lower electrodes and supports of the capacitor structure of FIG. 20.

Referring to FIGS. 20 and 21, the capacitor structure may have a plurality of lower electrodes 180, the dielectric layer 130, the upper electrode 132, and the plurality of supports 110a.

The lower electrodes 180 may be formed on the substrate 100, and may be electrically connected to a conductive region (not shown) of the substrate 100. In an example embodiment, each of the lower electrodes 180 may have a pillar shape. The lower electrodes 180 may have a planar top surface, of which a height may be substantially the same at any position. In example embodiments, the lower electrodes 180 may be formed in a first direction to define a lower electrode column. In the lower electrode column, the lower electrodes 180 may be arranged at a first distance from each other in the first direction. In example embodiments, a plurality of lower electrode columns may be formed in a second direction perpendicular to the first direction to define a lower electrode matrix. In the lower electrode matrix, the lower electrodes 180 may be arranged at a third distance from each other in a third direction that is at an acute angle to the second direction. Alternatively, the lower electrodes 180 may be arranged at a second distance from each other in the second direction.

The lower electrodes 180 may include a metal, a metal nitride, and/or doped polysilicon. For example, the lower electrodes 180 may include titanium, tantalum, titanium nitride, tantalum nitride, doped polysilicon, etc. When the lower electrodes 180 include metal, the lower electrodes 180 may have a capacitance higher than that of doped polysilicon lower electrodes.

The etch stop layer 102 may be further formed on a portion of the substrate 100 on which the lower electrodes 180 are not formed. The etch stop layer 102 may include silicon nitride.

The supports 110a may be formed on upper sidewalls of the lower electrodes 180, e.g., on upper sidewalls of at least two adjacent lower electrodes 180. Each support 110a may extend in the third direction, and may partially enclose the upper sidewalls of the lower electrodes 180. Alternatively, each support 110a may extend in the second direction, and may partially enclose the upper sidewalls of the lower electrodes 180. The supports 110a may be spaced apart from each other in the first direction. In example embodiments, each support 110a may enclose about half of an upper sidewall of each lower electrode 180.

The supports 110a may have a top surface coplanar with that of the lower electrodes 180. The supports 110a may include an insulating material. For example, the supports 110a may include silicon nitride.

The dielectric layer 130 may be formed on the lower electrodes 180, the supports 110, and the etch stop layer 102. In example embodiments, the dielectric layer 130 may be formed conformally thereon. The dielectric layer 130 may include a metal oxide and/or a metal oxynitride having a high dielectric constant. When the lower electrodes 180 include metal, the capacitor structure may have a low leakage current even though the dielectric layer 130 includes a high-k material.

For example, the dielectric layer 130 may include zirconium oxide, zirconium oxynitride, aluminum oxide, tantalum oxide, hafnium oxide, etc. These may be used alone or in a combination thereof. In example embodiments, the dielectric layer 130 may have a multi-layered structure including zirconium oxide layer/aluminum oxide layer/zirconium oxide layer (ZAZ) or zirconium oxide layer/aluminum oxide layer/tantalum oxide layer (ZAT).

Alternatively, when the lower electrodes 180 include doped polysilicon, the dielectric layer 130 may include a low-k material. For example, the dielectric layer 130 may have, e.g., a multi-layered structure including silicon oxide layer/silicon nitride layer/silicon oxide layer (ONO).

The upper electrode 132 may be formed on the dielectric layer 130. The upper electrode 132 may include a metal, a metal nitride, and/or doped polysilicon. When the dielectric layer includes the metal oxide, the upper electrode 132 may include the metal and/or the metal nitride, thereby reducing the leakage current of the capacitor structure. For example, the upper electrode 132 may include titanium, tantalum, titanium nitride, tantalum nitride. The upper electrode 132 may have a thickness of about several hundred angstroms.

The silicon-germanium layer 134 may be further formed on the upper electrode 132. The silicon-germanium layer 134 may be doped with p-type or n-type impurities.

Figure 22A:
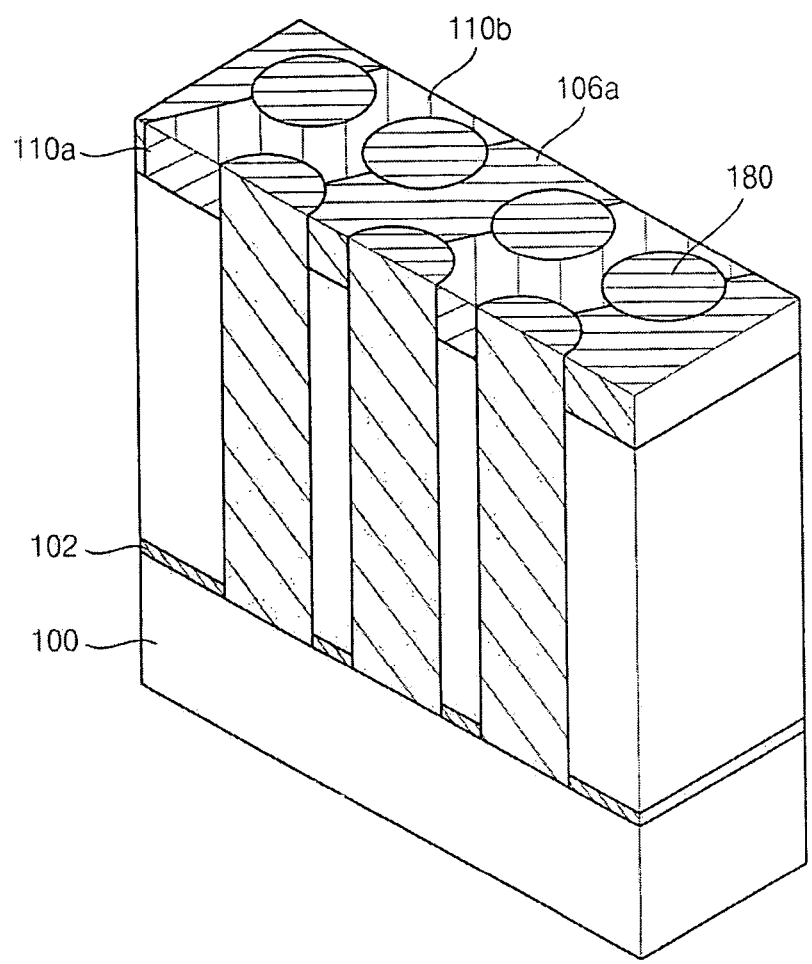
FIG. 22A illustrates a perspective view of a method of manufacturing a capacitor structure according to other example embodiments.
Figure 22B:
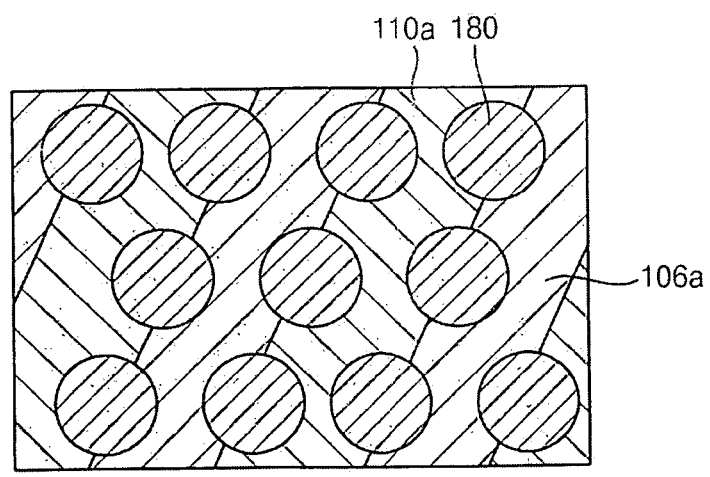
FIG. 22B illustrates a respective top view of the method in FIG. 22A.

FIG. 22A illustrates a perspective view of a method of manufacturing the capacitor structure in FIG. 20. FIG. 22B illustrates a top view of FIG. 22A.

First, processes substantially the same as or similar to those illustrated with reference to FIGS. 3A to 8A and 3B to 8B may be performed to form a plurality of holes 114 exposing top surfaces of the substrate 100.

Next, referring to FIGS. 22A and 22B, a lower electrode layer may be formed on the exposed top surfaces of the substrate 100, inner sidewalls of the holes 114, the supports 110a, and the first sacrificial layer patterns 106a to fill the holes 114. The lower electrode layer may be formed by a CVD process, a physical vapor deposition (PVD) process, or an atomic layer deposition (ALD) process.

The lower electrode layer may be formed using a metal, a metal nitride, and/or doped polysilicon. For example, the lower electrode layer may be formed using titanium, tantalum, aluminum, titanium nitride, tantalum nitride, aluminum nitride, etc.

An upper portion of the lower electrode layer on the supports 110a and the first sacrificial layer patterns 106a may be removed by a CMP process and/or an etch back process. Thus, a plurality of lower electrodes 180 filling the holes 114 may be formed on the substrate 100.

Referring to FIG. 21 again, the first sacrificial layer patterns 106a and the mold layer 104 may be removed. In example embodiments, the removal may be performed by a wet etching process.

A dielectric layer 130 may be formed on the lower electrodes 180, the supports 110a, and the etch stop layer 102. The dielectric layer 130 may be formed using a metal oxide and/or a metal oxynitride having a high dielectric constant. The dielectric layer 130 may be formed by a CVD process or an ALD process. For example, the dielectric layer 130 may be formed using zirconium oxide, zirconium oxynitride, aluminum oxide, tantalum oxide, hafnium oxide, etc. These may be used alone or in a combination thereof. In example embodiments, the dielectric layer 130 may be formed to have a multi-layered structure including zirconium oxide layer/aluminum oxide layer/zirconium oxide layer (ZAZ) or zirconium oxide layer/aluminum oxide layer/tantalum oxide layer (ZAT).

Alternatively, when the lower electrodes 180 include doped polysilicon, the dielectric layer 130 may be formed using a low-k material. For example, the dielectric layer 130 may be formed to have, e.g., a multi-layered structure including silicon oxide layer/silicon nitride layer/silicon oxide layer (ONO).

The upper electrode 132 may be formed on the dielectric layer 130. The upper electrode 132 may be formed using a metal, a metal nitride and/or doped polysilicon. For example, the upper electrode 132 may be formed using titanium, tantalum, titanium nitride, tantalum nitride. The upper electrode 132 may be formed by a CVD process, a PVD process or an ALD process. Thus, the capacitor structure may be manufactured.

Figure 23A:
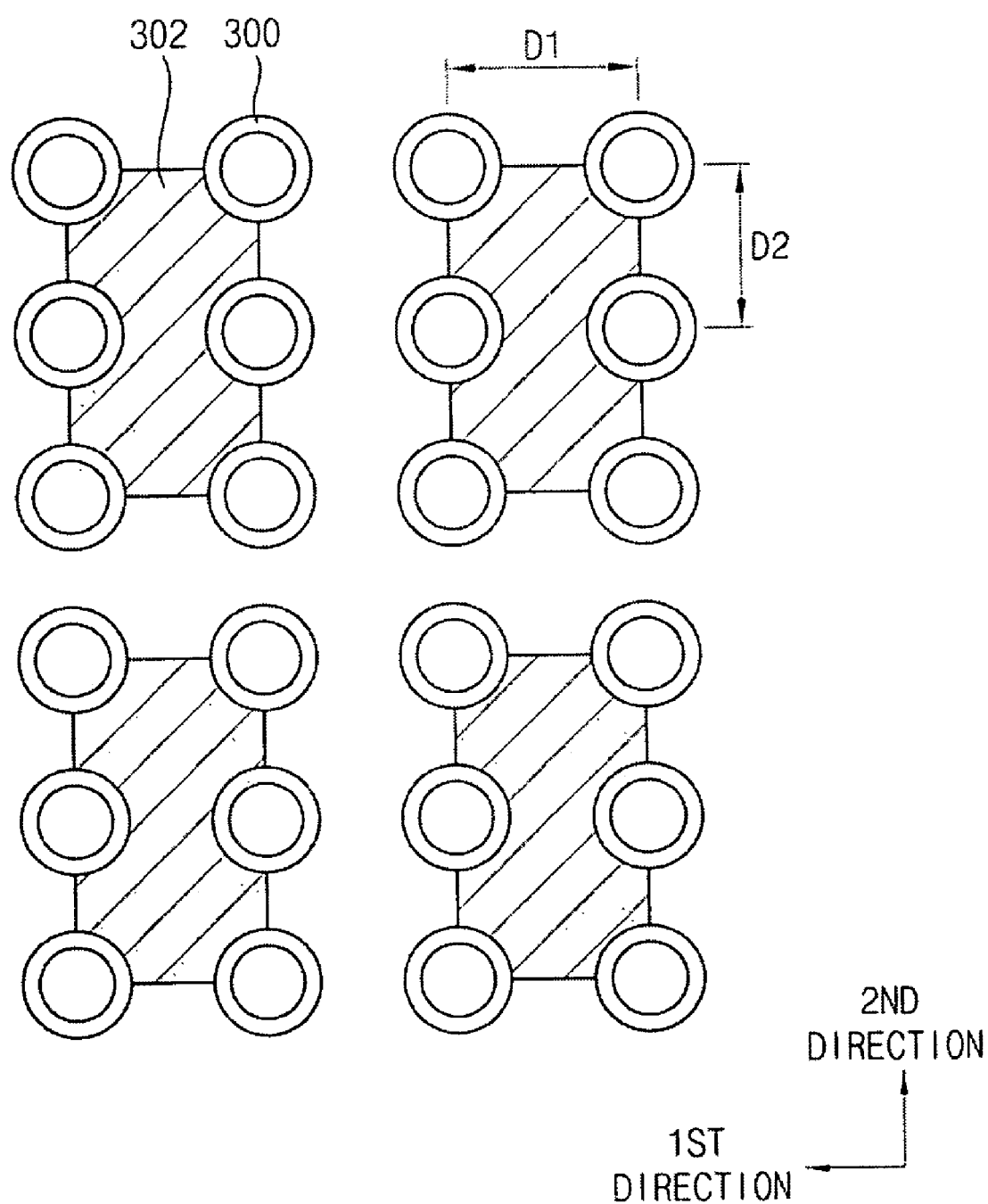
FIG. 23A illustrates a top view of an arrangement of lower electrodes and supports of a capacitor structure in accordance with example embodiments.

FIG. 23A illustrates a top view of lower electrodes and supports of a capacitor structure in accordance with example embodiments. The capacitor structure in FIG. 23A may be substantially the same as or similar to that of FIGS. 1 and 2, except for the arrangement of the lower electrodes and the shape of the supports.

Referring to FIG. 23A, a plurality of lower electrodes 300 having a cylindrical shape may be formed on a substrate (not shown). The lower electrodes 300 may have a top surface of which a height may be substantially the same at any position. In example embodiments, the lower electrodes 300 may be formed in a first direction to define a lower electrode column. In the lower electrode column, the lower electrodes 300 may be arranged at a first distance D1 from each other in the first direction. In example embodiments, a plurality of lower electrode columns may be formed in a second direction perpendicular to the first direction to define a lower electrode matrix. In the lower electrode matrix, the lower electrodes 300 may be arranged at a second distance D2 from each other in the second direction.

A plurality of supports 302 may be formed on upper sidewalls of at least two adjacent lower electrodes 300. For example, each support 302 may be formed on upper sidewalls of two adjacent lower electrodes 300 in the first direction. Each support 302 may extend in the second direction, and may partially enclose the upper sidewalls of several lower electrodes 300. In example embodiments, each support 302 may enclose about half of an upper sidewall of each lower electrode 300. The supports 302 may be spaced apart from each other in the first direction. The supports 302 may have a top surface coplanar with that of the lower electrodes 300.

The capacitor structure in FIG. 23A may be manufactured by performing processes substantially the same or similar to those illustrated with reference to FIGS. 3A to 12A and 3B to 12B, except for forming a photoresist pattern having a different shape.

Figure 23B:
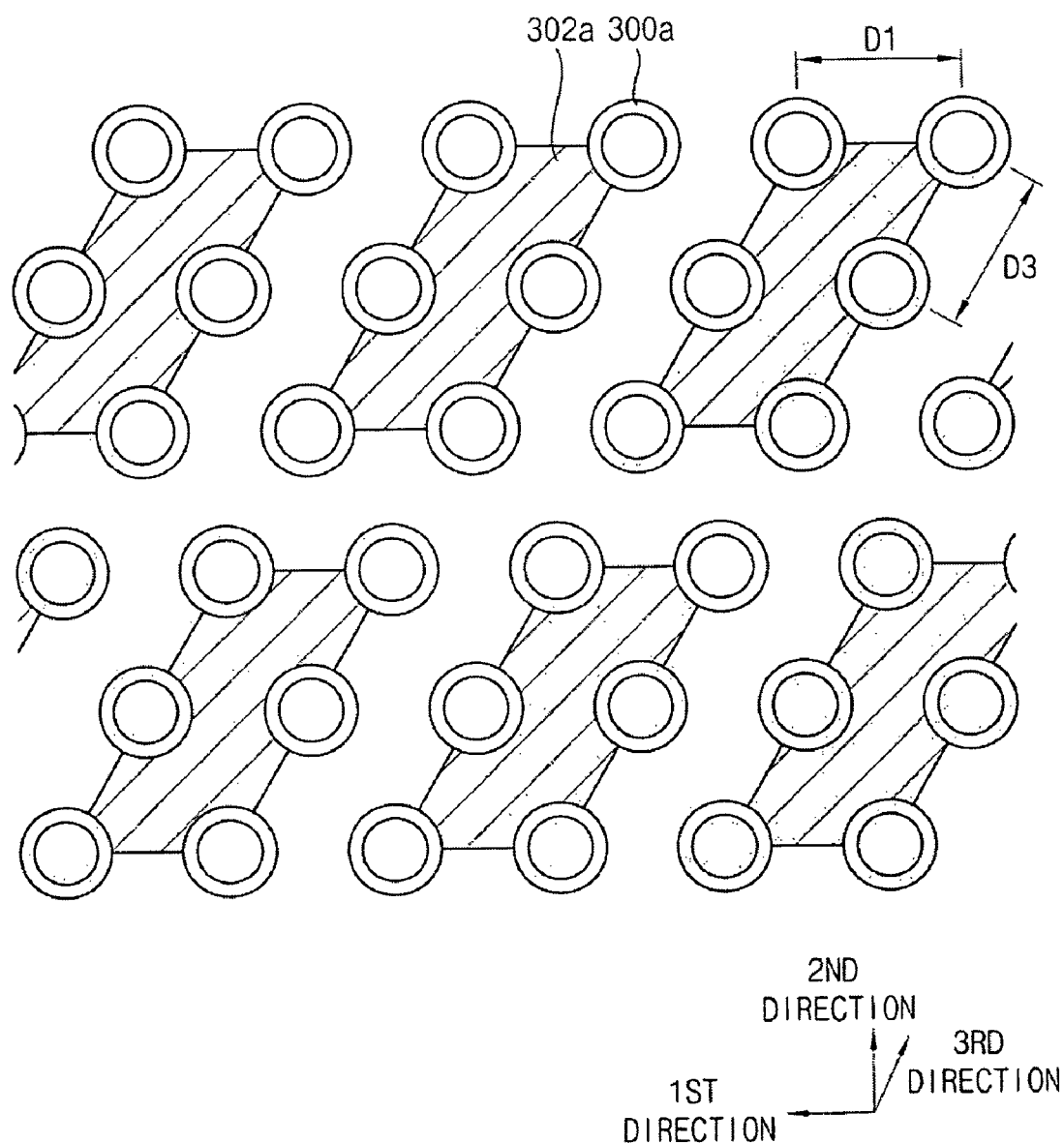
FIG. 23B illustrates a top view of an arrangement of lower electrodes and supports of a capacitor structure in accordance with example embodiments.

FIG. 23B illustrates a top view of lower electrodes and supports of a capacitor structure in accordance with example embodiments. The capacitor structure in FIG. 23B may be substantially the same as or similar to that of FIGS. 1 and 2. That is, the arrangement of the lower electrodes and the shape of the supports may be illustrated in detail in FIG. 23B.

Referring to FIG. 23B, a plurality of lower electrodes 300a having a cylindrical shape may be formed on a substrate (not shown). The lower electrodes 300a may have a top surface of which a height may be substantially the same at any position. In example embodiments, the lower electrodes 300a may be formed in a first direction to define a lower electrode column. In the lower electrode column, the lower electrodes 300a may be arranged at a first distance D1 from each other in the first direction. In example embodiments, a plurality of lower electrode columns may be formed in a second direction perpendicular to the first direction to define a lower electrode matrix. In the lower electrode matrix, the lower electrodes 300a may be arranged at a third distance D3 from each other in a third direction at an acute angle to the second direction, e.g., six lower electrodes 300a may be arranged in a shape of a parallelogram as viewed from a top view. The first and second directions may be substantially perpendicular to each other.

A plurality of supports 302a may be formed on upper sidewalls of at least two adjacent lower electrodes 300a. For example, each support 302a may be formed on upper sidewalls of two adjacent lower electrodes 300a in the first direction. Each support 302a may extend in the third direction, and may partially enclose the upper sidewalls of several lower electrodes 300a. In example embodiments, each support 302a may enclose about half of an upper sidewall of each lower electrodes 300a. The supports 302a may be spaced apart from each other in the first direction. The supports 302a may have a top surface coplanar with that of the lower electrodes 300a. The capacitor structure in FIG. 23B may be manufactured by performing processes substantially the same or similar to those illustrated with reference to FIGS. 3A to 12A.

Figure 24A:
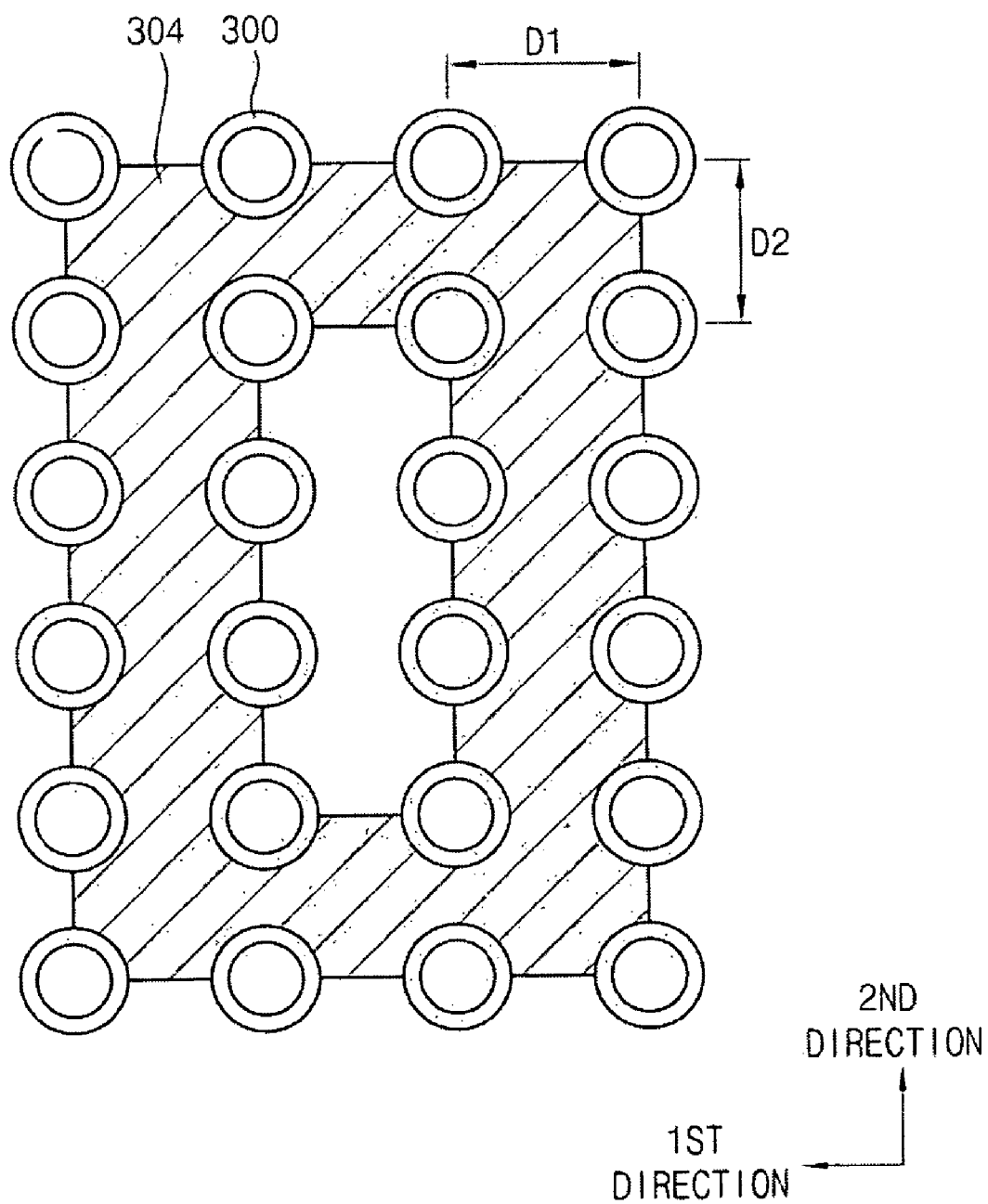
FIG. 24A illustrates a top view of an arrangement of lower electrodes and supports of a capacitor structure in accordance with example embodiments.

FIG. 24A illustrates a top view of lower electrodes and supports of a capacitor structure in accordance with other example embodiments. The capacitor structure in FIG. 24A may be substantially the same as or similar to that of FIGS. 1 and 2, except for the arrangement of the lower electrodes and the shape of the supports.

Referring to FIG. 24A, a plurality of lower electrodes 300 having a cylindrical shape may be formed on a substrate (not shown). The lower electrodes 300 may have a top surface of which a height may be substantially the same at any position. In example embodiments, the lower electrodes 300 may be formed in a first direction to define a lower electrode column. In the lower electrode column, the lower electrodes 300 may be arranged at a first distance D1 from each other in the first direction. In example embodiments, a plurality of lower electrode columns may be formed in a second direction perpendicular to the first direction to define a lower electrode matrix. In the lower electrode matrix, the lower electrodes 300 may be arranged at a second distance D2 from each other in the second direction.

A plurality of supports 304 may be formed on upper sidewalls of at least two adjacent lower electrodes 300. In example embodiments, each support 304 may have an annular shape from a top view. For example, each support 304 may have two column portions, each of which is formed on upper sidewalls of two adjacent lower electrodes 300 in the second direction and extend in the first direction, and two row portions, each of which is formed on upper sidewalls of two adjacent lower electrodes 300 in the first direction and extends in the second direction. The capacitor structure in FIG. 24A may be manufactured by performing processes substantially the same or similar to those illustrated with reference to FIGS. 3A to 12A and 3B to 12B, except for forming a photoresist pattern having a different shape.

Figure 24B:
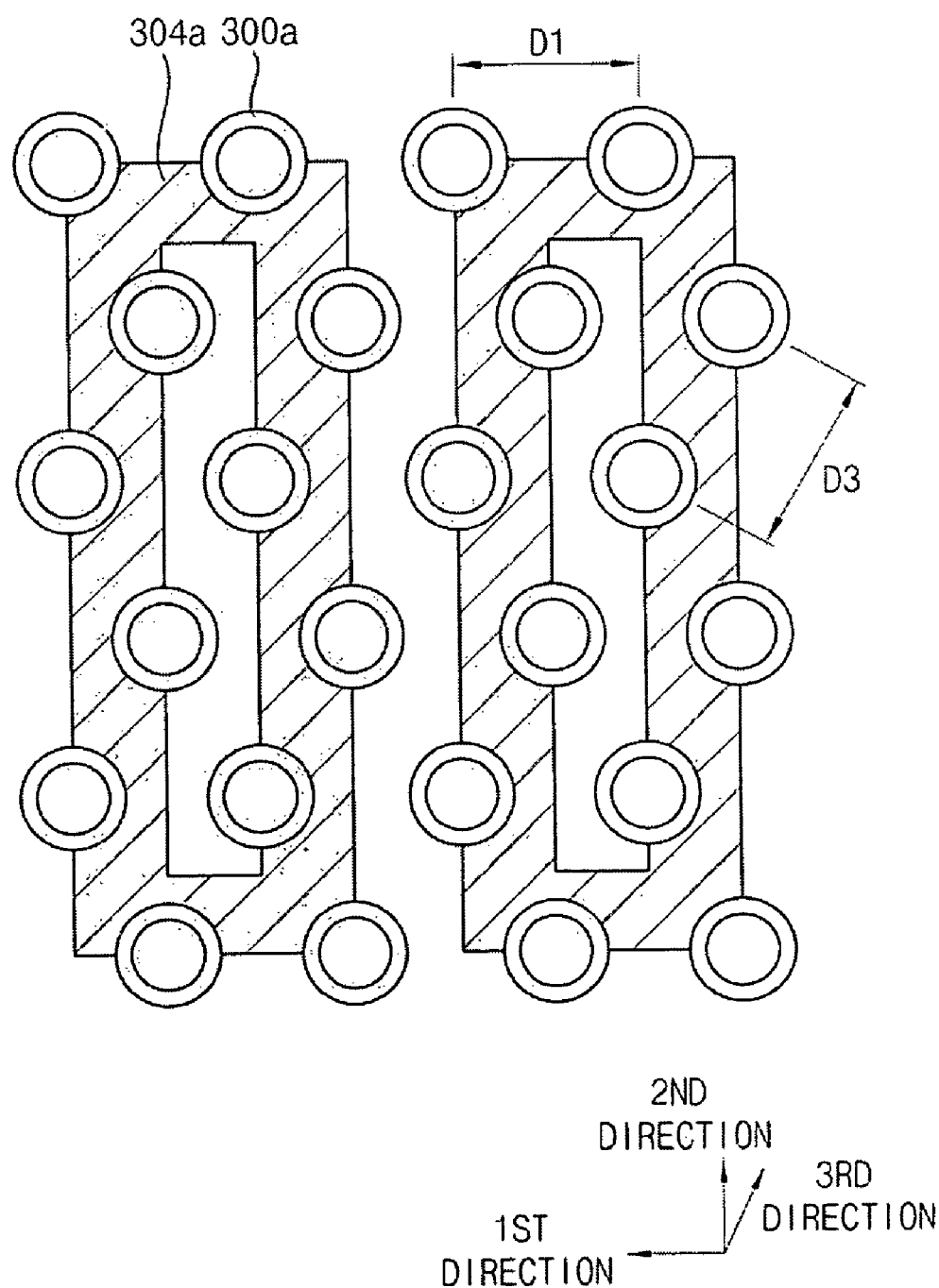
FIG. 24B illustrates a top view of an arrangement of lower electrodes and supports of a capacitor structure in accordance with example embodiments.

FIG. 24B illustrates a top view of lower electrodes and supports of a capacitor structure in accordance with other example embodiments. The capacitor structure in FIG. 24B may be substantially the same as or similar to that of FIGS. 1 and 2, except for the shape of the supports.

Referring to FIG. 24B, a plurality of lower electrodes 300a having a cylindrical shape may be formed on a substrate (not shown). The lower electrodes 300a may have a top surface of which a height may be substantially the same at any position. In example embodiments, the lower electrodes 300a may be formed in a first direction to define a lower electrode column. In the lower electrode column, the lower electrodes 300a may be arranged at a first distance D1 from each other in the first direction. In example embodiments, a plurality of lower electrode columns may be formed in a second direction perpendicular to the first direction to define a lower electrode matrix. In the lower electrode matrix, the lower electrodes 300 may be arranged at a third distance D3 from each other in a third direction at an acute angle to the second direction.

A plurality of supports 304a may be formed on upper sidewalls of at least two adjacent lower electrodes 300a. In example embodiments, each support 304a may have an annular shape from a top view. For example, each support 304a may have two column portions, each of which is formed on upper sidewalls of two adjacent lower electrodes 300a in the first direction and extends in the first direction, and two row portions each of which is formed on upper sidewalls of two adjacent lower electrodes 300a in the third direction and extends in the second direction. The capacitor structure in FIG. 24B may be manufactured by performing processes substantially the same or similar to those illustrated with reference to FIGS. 3A to 12A and 3B to 12B, except for forming a photoresist pattern having a different shape.

Figure 24C:
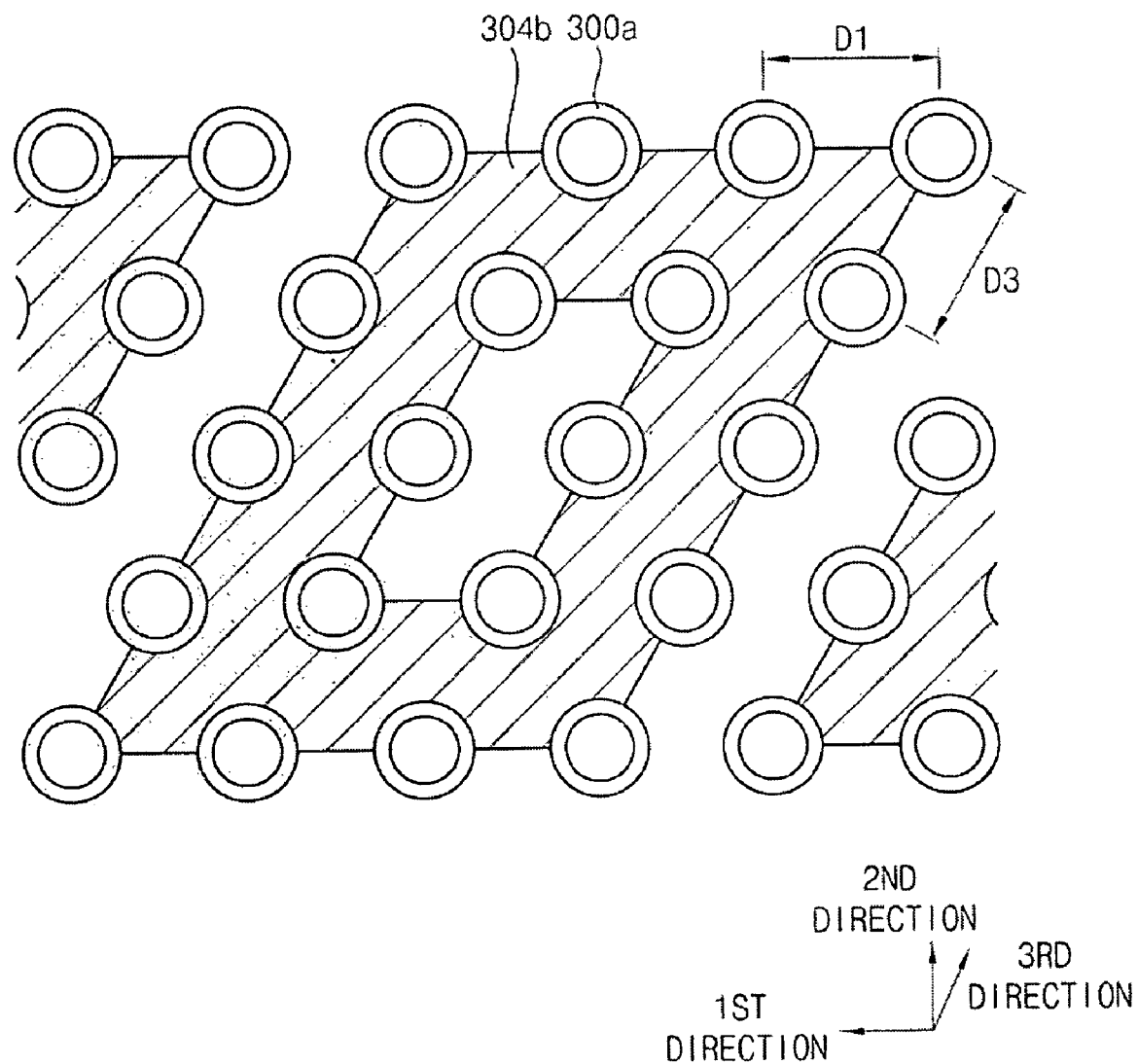
FIG. 24C illustrates a top view of an arrangement of lower electrodes and supports of a capacitor structure in accordance with example embodiments.

FIG. 24C illustrates a top view of lower electrodes and supports of a capacitor structure in accordance with other example embodiments. The capacitor structure in FIG. 24C may be substantially the same as or similar to that of FIGS. 1 and 2, except for the shape of the supports.

Referring to FIG. 24C, a plurality of lower electrodes 300a having a cylindrical shape may be formed on a substrate (not shown). The lower electrodes 300a may have a top surface of which a height may be substantially the same at any position. In example embodiments, the lower electrodes 300a may be formed in a first direction to define a lower electrode column. In the lower electrode column, the lower electrodes 300a may be arranged at a first distance D1 from each other in the first direction. In example embodiments, a plurality of lower electrode columns may be formed in a second direction perpendicular to the first direction to define a lower electrode matrix. In the lower electrode matrix, the lower electrodes 300 may be arranged at a third distance D3 from each other in a third direction at an acute angle to the second direction.

A plurality of supports 304b may be formed on upper sidewalls of at least two adjacent lower electrodes 300a. In example embodiments, each support 304b may have an annular shape from a top view. For example, each support 304b may have two column portions, each of which is formed on upper sidewalls of two adjacent lower electrodes 300a in the third direction and extends in the first direction, and two row portions, each of which is formed on upper sidewalls of two adjacent lower electrodes 300a in the first direction and extends in the third direction. The capacitor structure in FIG. 24C may be manufactured by performing processes substantially the same or similar to those illustrated with reference to FIGS. 3A to 12A and 3B to 12B, except for forming a photoresist pattern having a different shape.

Figure 25:
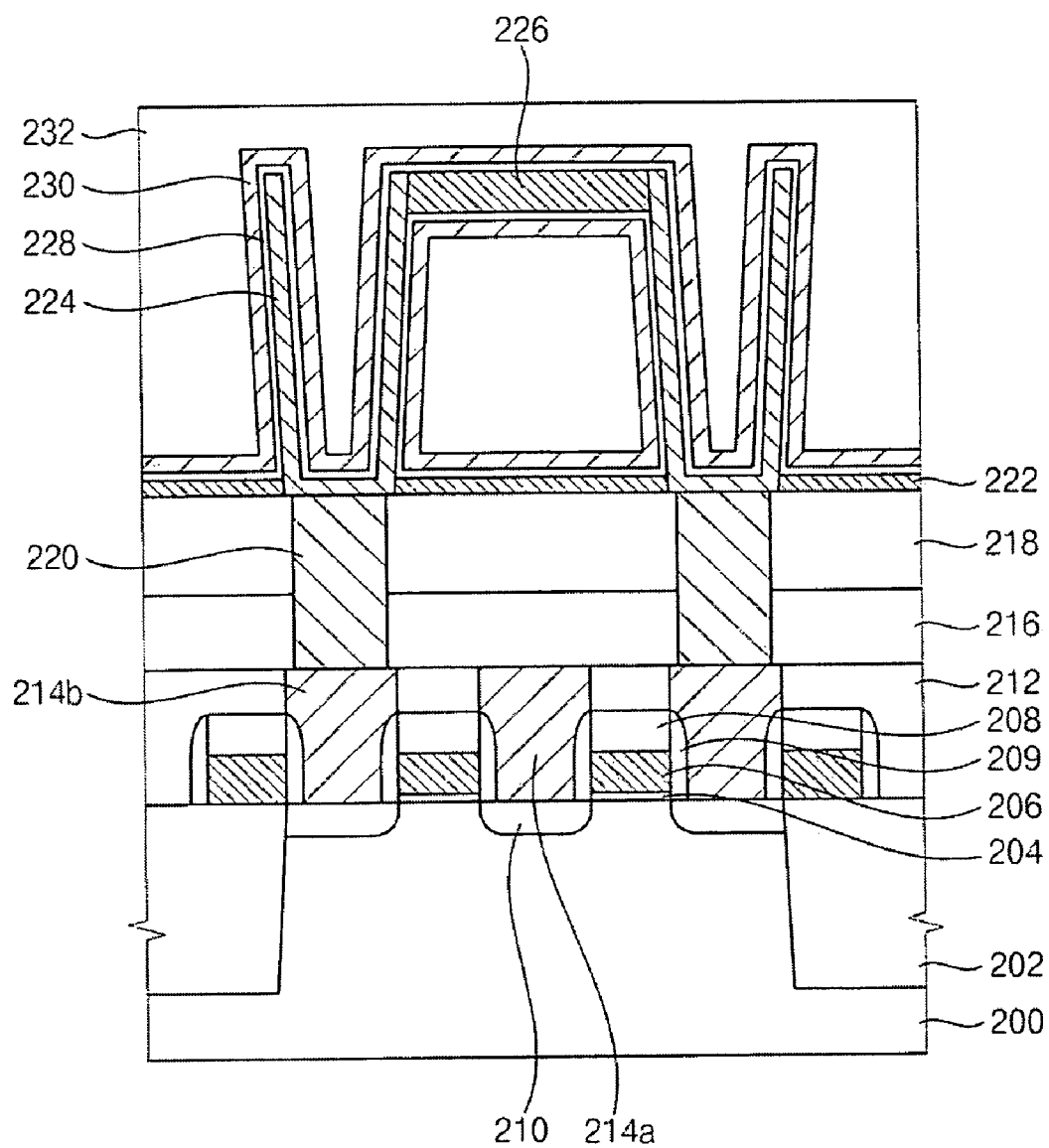
FIG. 25 illustrates a cross-sectional view of a dynamic random access memory (DRAM) device including a capacitor structure in accordance with example embodiments.

FIG. 25 illustrates a cross-sectional view of a DRAM device including the capacitor structure of FIG. 1 in accordance with example embodiments. Referring to FIG. 25, a substrate 200 including an active region and a field region may be provided. The active region may be defined by an isolation layer 202 on the substrate 200, and may have an island shape.

A metal-oxide-semiconductor (MOS) transistor may be formed on the substrate 200. The transistor may have a gate structure including a gate insulation layer pattern 204, a gate electrode 206, a gate mask 208, and a source/drain region 210. The gate structure may further include a gate spacer 209.

A first insulating interlayer 212 covering the transistor may be formed on the substrate 200 and the isolation layer 202. A first contact plug 214a and a second contact plug 214b may be formed through the first insulating interlayer 212, and may contact the source/drain region 210.

A second insulating interlayer 216 may be formed on the first insulating interlayer 212 and the first and second contact plugs 214a and 214b. A bitline contact plug (not shown) may be formed through the second insulating interlayer 216, and may be electrically connected to the first contact plug 214a. Additionally, a bitline (not shown) may be formed on the second insulating interlayer 216, and may be electrically connected to the bitline contact plug.

A third insulating interlayer 218 covering the bitline may be formed on the second insulating interlayer 216. A capacitor contact plug 220 may be formed through the second and third insulating interlayers 216 and 218, and may be electrically connected to the second contact plug 214b. In example embodiments, a plurality of capacitor contact plugs 220 may be formed.

The capacitor structure of FIG. 1 may be formed on the third insulating interlayer 218, and may be electrically connected to the capacitor contact plugs 220. Additionally, an etch stop layer 222 may be formed on a portion of the third insulating interlayer 218 on which the capacitor structures are not formed. The capacitor structure may include a plurality of lower electrodes 224, a dielectric layer 228, an upper electrode 230, and a plurality of supports 226. The capacitor structure may further include a silicon-germanium layer 232 on the upper electrode 230.

The DRAM device may have reduced 2-bit failures because of the capacitor structure, thereby having good electrically characteristics. The DRAM device may have other types of capacitor structures instead of the capacitor structure of FIG. 1, e.g., the capacitor structure of FIG. 20.

Figure 26:
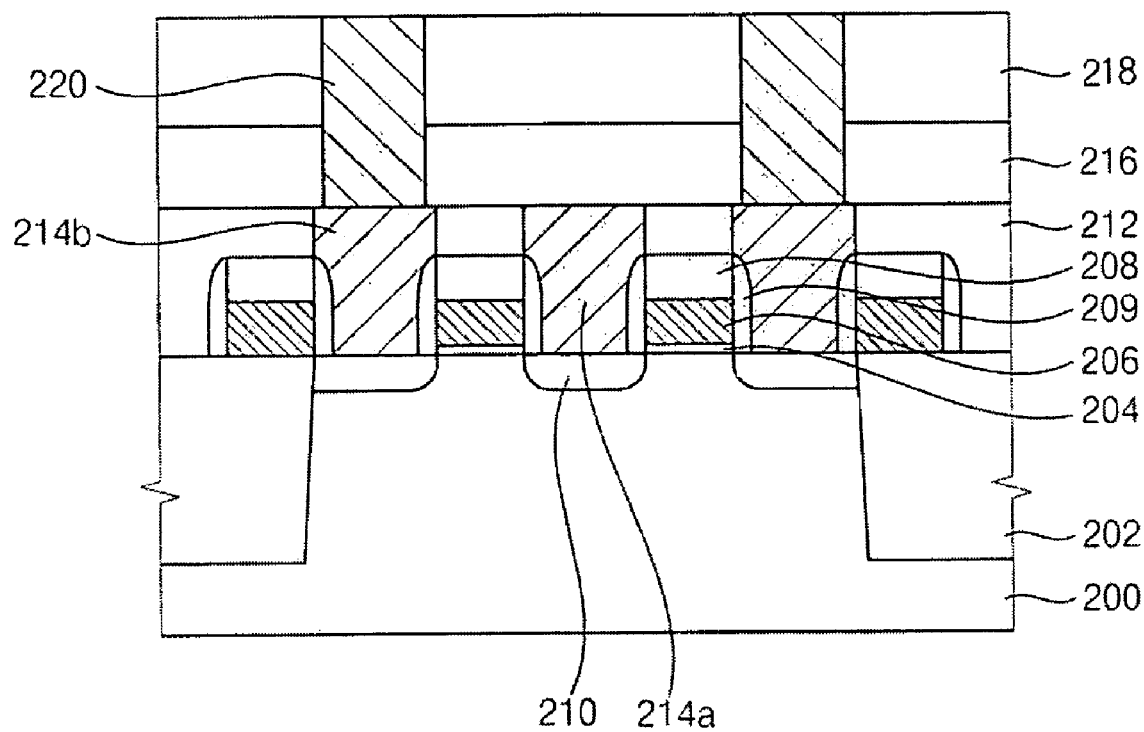
FIG. 26 illustrates a cross-sectional view of a method of manufacturing a DRAM device including a capacitor in accordance with example embodiments.

FIG. 26 illustrates a cross-sectional view of a method of manufacturing a DRAM device including the capacitor structure of FIG. 1 in accordance with example embodiments.

Referring to FIG. 26, a pad oxide layer (not shown) and a hard mask layer (not shown) may be formed on the substrate 200. The hard mask layer and the pad oxide layer may be patterned to form a hard mask (not shown) and a pad oxide layer pattern (not shown), respectively. The substrate 200 may be partially etched using the hard mask as an etching mask to form a trench (not shown). An insulating material may be deposited on the substrate 200 to fill the trench, and an upper portion thereof may be planarized to form an isolation layer 202 in the trench. Thus, the substrate 200 may be divided into an active region and a field region.

A gate insulation layer, a gate conductive layer, and a gate mask 208 may be sequentially formed on the substrate 200. The gate conductive layer and the gate insulation layer may be partially removed using the gate mask 208 as an etching mask to form the gate electrode 206 and the gate insulation layer pattern 204, respectively. The gate mask 208, the gate electrode 206, and the gate insulation layer pattern 204 may define the gate structure. The gate spacer 209 may be further formed on a sidewall of the gate structure.

Impurities may be implanted into a portion of the active region of the substrate 200 adjacent to the gate structure to form the source/drain region 210. In example embodiments, a plurality of source/drain regions 210 may be formed. Thus, a MOS transistor including the gate structure and the source/drain region 210 may be manufactured.

The first insulating interlayer 212 may be formed on the substrate 200 to cover the transistor. The first insulating interlayer 212 may be partially removed to form first contact holes (not shown) exposing the source/drain regions 210. The first conductive layer may be formed on the exposed source/drain regions 210 and the first insulating interlayer 212 to fill the first contact holes. An upper portion of the first conductive layer may be planarized to form the first contact plug 214a and the second contact plug 214b electrically connected to the source/drain regions 210.

The second insulating interlayer 216 may be formed on the first insulating interlayer 212 and the first and second contact plugs 214a and 214b. The second insulating interlayer 216 may be partially etched to form a second contact hole (not shown) therethrough exposing the first contact plug 214a. A second conductive layer may be formed on the exposed first contact plug 214a and the second insulating interlayer 216 to fill the second contact hole, and an upper portion thereof may be planarized to form the bitline contact (not shown) electrically connected to the first contact plug 214a. The bitline (not shown) may be formed on the second insulating interlayer 216 to be electrically connected to the bitline contact.

The third insulating interlayer 218 may be formed on the second insulating interlayer 216 to cover the bitline. The third and second insulating interlayers 218 and 216 may be partially etched to form third contact holes (not shown) therethrough exposing the second contact plugs 214b. A third conductive layer may be formed on the exposed second contact plugs 214b and the second and third insulating interlayers 216 and 218 to fill the third contact holes, and an upper portion thereof may be planarized to form capacitor contact plugs 220.

Processes substantially the same as or similar to those illustrated with reference to FIG. 3A to 12A and 3B to 12B may be performed to complete the capacitor structure of FIG. 1 and the DRAM device.

Figure 27:
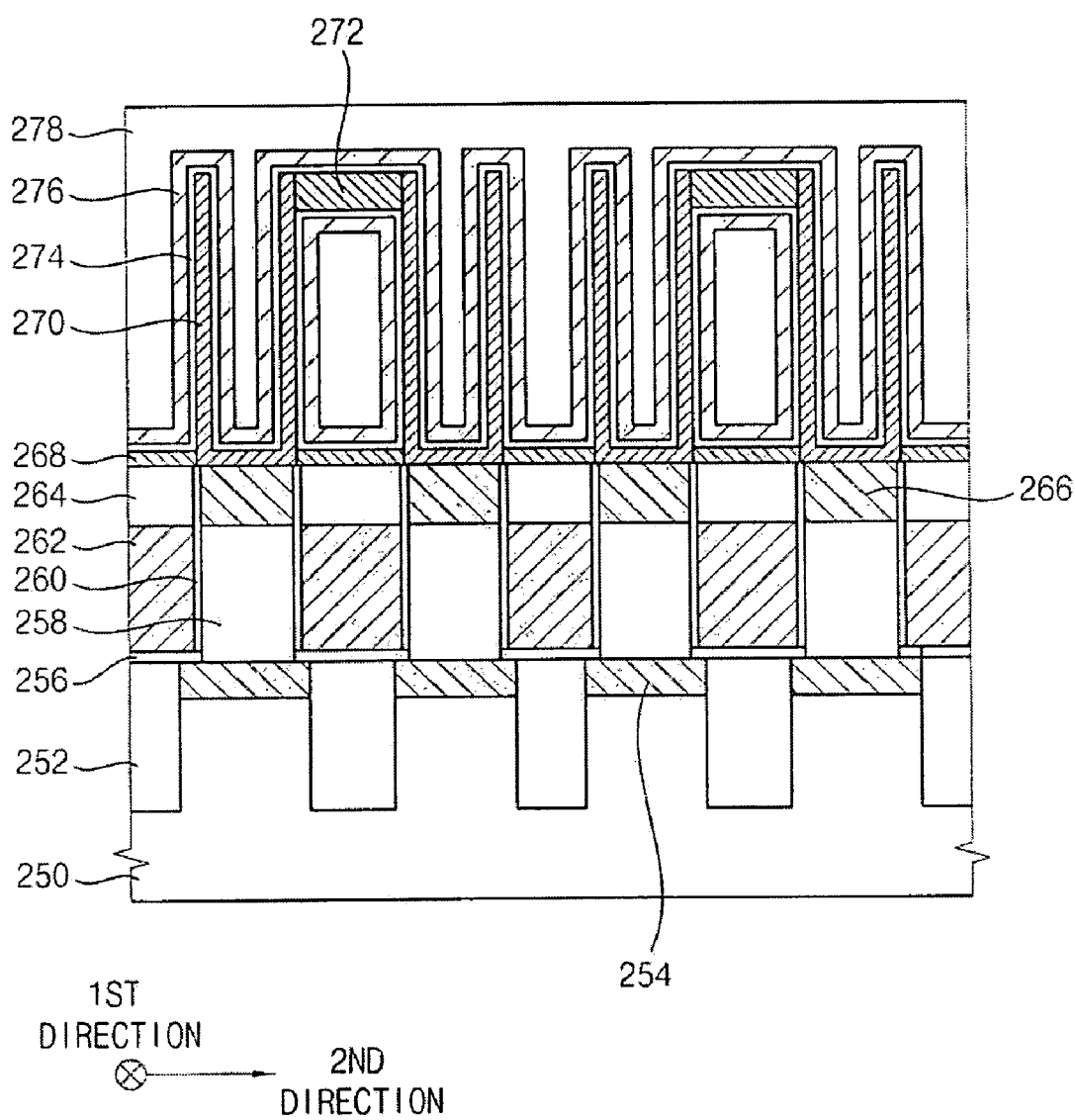
FIG. 27 illustrates a cross-sectional view of a DRAM device including a capacitor in accordance with other example embodiments.

FIG. 27 illustrates a cross-sectional view of a DRAM device including the capacitor of FIG. 1 in accordance with example embodiments.

Referring to FIG. 27, a substrate 250 including an active region and a field region may be provided. The active region may be defined by an isolation layer 252 on the substrate 250. The active region and the field region may extend in a first direction. The active region and the field region may be alternately formed in a second direction perpendicular to the first direction.

A buried bitline 254 may be formed at an upper portion of each active region. The buried bitline 254 may be doped with impurities.

A pillar 258 may be formed on each active region. The pillar 258 may have single crystalline silicon. A gate insulation layer 260 may be formed on sidewalls of each pillar 258. A gate electrode 262 may be formed on the gate insulation layer 260 and on an insulation layer pattern 256, which is formed on the substrate 250 and the isolation layer 252. The gate electrode 262 may be insulated from the substrate 250. The gate electrode 262 may enclose lower sidewalls of the pillars 258 and extend in the second direction.

An insulating interlayer 264 may be formed on the substrate 250, the gate electrode 262, and the gate insulation layer 260 to fill spaces between the pillars 258 and spaces between the gate electrodes 262. The insulating interlayer 264 may have a top surface of which a height is substantially the same as that of the pillars 258. An impurity region 266 may be formed at an upper portion of each pillar 258, and may serve as a source/drain region.

The capacitor structure of FIG. 1 may be formed on the insulating interlayer 264 and the impurity regions 266 of the pillars 258. The capacitor structure may include a plurality of lower electrodes 270, a dielectric layer 274, an upper electrode 276, and supports 272. The capacitor structure may further include a silicon-germanium layer 278 on the upper electrode. The lower electrodes 270 may be electrically connected to the impurity regions 266. An etch stop layer 268 may be formed on a portion of the insulating interlayer 264 on which the lower electrode 270 is not formed.

The DRAM device may have other types of capacitor structures instead of the capacitor structure of FIG. 1, e.g., the capacitor structure of FIG. 20.

According to example embodiments, the capacitor structure may include a plurality of supports supporting the capacitors, and thus falling down of the capacitors may be substantially reduced or prevented. The supports may be formed before forming the lower electrodes of the capacitors, and thus may not be damaged during the formation thereof.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a capacitor structure, comprising:
    forming a mold layer on a substrate;
    forming a plurality of sacrificial layer patterns in contact with a plurality of supports on the substrate, such that the plurality of sacrificial layer patterns have top surfaces substantially level with top surfaces of the supports and bottom surfaces substantially level with bottom surfaces of the supports, the sacrificial layer patterns and the supports being parallel to each other and being arranged in an alternating stripe pattern on the substrate;
    partially removing the sacrificial layer patterns, the supports, and the mold layer to form a plurality of holes therethrough exposing top surfaces of the substrate, the holes being arranged in a first direction to define a column, and a plurality of columns being arranged in a second direction perpendicular to the first direction to define a matrix;
    forming a plurality of lower electrodes in the holes on the exposed top surfaces of the substrate, such that the lower electrodes have planar top surfaces and the plurality of supports are on upper sidewalls of at least two adjacent lower electrodes;
    removing the sacrificial layer patterns;
    removing the mold layer to expose sidewalls of the lower electrodes;
    forming a dielectric layer on the lower electrodes and the supports; and
    forming an upper electrode on the dielectric layer.

2. The method as claimed in claim 1, wherein forming the sacrificial layer patterns and the supports includes:
    forming the sacrificial layer patterns on the mold layer;
    forming a supporting layer on the mold layer to cover the sacrificial layer patterns and fill spaces between the sacrificial layer patterns; and
    planarizing an upper portion of the supporting layer to form the supports.

3. The method as claimed in claim 1, wherein forming the sacrificial layer patterns and the supports includes:
    forming the supports on the mold layer;
    forming a sacrificial layer on the mold layer to cover the supports and fill spaces between the supports; and
    planarizing an upper portion of the sacrificial layer to form the sacrificial layer patterns.

4. The method as claimed in claim 1, wherein forming the lower electrodes includes:
    forming a lower electrode layer conformally on the exposed top surface of the substrate, inner walls of the holes, the sacrificial layer patterns, and the supports; and
    removing an upper portion of the lower electrode layer from the sacrificial layer patterns and the supports to form the lower electrodes with a cylindrical shape.

5. The method as claimed in claim 4, further comprising, prior to removing the upper portion of the lower electrode layer, forming a second sacrificial layer on the lower electrode to fill remaining portions of the holes.

6. The method as claimed in claim 4, further comprising, after forming the lower electrodes, forming second sacrificial layer patterns filling remaining portions of the holes.

7. The method as claimed in claim 6, wherein removing the mold layer includes removing the second sacrificial layer patterns.

8. The method as claimed in claim 1, wherein forming the lower electrodes includes:
    forming a conductive layer on the exposed top surfaces of the substrate, the sacrificial layer patterns and the supports to fill the holes; and
    removing an upper portion of the conductive layer from the sacrificial layer patterns and the supports.

9. The method as claimed in claim 1, wherein the sacrificial layer patterns are formed using silicon-germanium.

10. The method as claimed in claim 1, wherein the supports are formed using silicon nitride.

11. The method as claimed in claim 1, wherein each support is formed to have a linear shape.

12. The method as claimed in claim 1, wherein the holes are formed at a first distance from each other in the first direction, and at a second distance from each other in a third direction, the third direction being oriented at an acute angle with respect to the second direction.

13. The method as claimed in claim 1, wherein forming the plurality of holes exposing top surfaces of the substrate includes having each of the sacrificial layer patterns and supports overlap different portions of respective perimeters of the holes.

14. The method as claimed in claim 1, wherein forming the plurality of holes exposing top surfaces of the substrate includes having each of the stripes of the and supports define opposite parts of each hole.

15. The method as claimed in claim 1, wherein:
    forming the plurality of sacrificial layer patterns includes forming discrete portions of the sacrificial layer patterns spaced apart from each other;
    forming the supports includes forming discrete portions of the supports spaced apart from each other, such that the discrete portions of the sacrificial layer patterns and supports contact each other and are arranged in an alternating pattern; and
    forming the plurality of holes includes forming openings through contact regions between the portions of the sacrificial layer patterns and supports, such that the sacrificial layer patterns and supports define different portions of each opening along a perimeter of the opening.

16. The method as claimed in claim 1, wherein forming the plurality of lower electrodes includes forming each support to linearly extend between two columns of lower electrodes, the support surrounding about half a perimeter of each lower electrode in each of the columns.

17. The method as claimed in claim 1, wherein forming the plurality of lower electrodes includes forming each support to fill a distance among top portions of lower electrodes in two adjacent columns of lower electrodes, adjacent supports being substantially linear and spaced apart from each other.

* * * * *